(12) United States Patent
Goda et al.

(10) Patent No.: US 6,953,965 B2
(45) Date of Patent: Oct. 11, 2005

(54) SEMICONDUCTOR DEVICE WITH SOURCE LINE AND FABRICATION METHOD THEREOF

(75) Inventors: Akira Goda, Yokohama (JP); Mitsuhiro Noguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/455,711

(22) Filed: Jun. 6, 2003

(65) Prior Publication Data

US 2004/0026748 A1 Feb. 12, 2004

(30) Foreign Application Priority Data

Jun. 6, 2002 (JP) ....................... 2002-165698

(51) Int. Cl.[7] .............................. H01L 29/788
(52) U.S. Cl. .................... 257/316; 257/315
(58) Field of Search ................... 257/315, 316, 257/326, 390, E29, 121, E29.3; 365/185.17, 185.33

(56) References Cited

U.S. PATENT DOCUMENTS

| 6,127,224 | A | 10/2000 | Pio |
| 6,160,297 | A | 12/2000 | Shimizu et al. |
| 6,380,032 | B1 | 4/2002 | Lee et al. |
| 6,411,548 | B1 | 6/2002 | Sakui et al. |
| 6,703,661 | B2 * | 3/2004 | Wu ........................... 257/315 |
| 6,720,579 | B2 * | 4/2004 | Shin et al. ................. 257/68 |

FOREIGN PATENT DOCUMENTS

| JP | 2001-223284 | 8/2001 |
| KR | 2001-0081246 | 8/2001 |

OTHER PUBLICATIONS

Jung–Dai Choi, et al., "A 0.15 µm NAND Flash Technology with 0.11 µm[2] Cell Size for 1 Gbit Flash Memory", 2000 IEEE, IEDM Tech. Dig., (–4– pages).

* cited by examiner

*Primary Examiner*—Tom Thomas
*Assistant Examiner*—Matthew C Landau
(74) *Attorney, Agent, or Firm*—Oblon, Spivak, McClelland, Maier & Neustadt, P.C.

(57) ABSTRACT

A semiconductor device comprises a plurality of field-effect transistors and a common source line. Each of the plurality of memory cell transistors includes a semiconductor region of a first conductivity type formed in a semiconductor substrate, a source region and a drain region of a second conductivity type formed in the semiconductor region, an information storage portion capable of electrically writing and erasing data, and at least one control gate electrode including a conductive layer. The common source line is formed on the semiconductor region of the first conductivity type, and electrically connects the source regions of the memory cell transistors. The common source line includes a conductive layer that has a film thickness substantially equal to a film thickness of the conductive layer included in the control gate electrode and is formed of the same material as that of the conductive layer included in the control gate electrode.

6 Claims, 21 Drawing Sheets

SEMICONDUCTOR DEVICE WITH SOURCE LINE AND FABRICATION METHOD THEREOF

CROSS-REFERENCE TO RELATED APPLICATIONS

This application is based upon and claims the benefit of priority from the prior Japanese Patent Application No. 2002-165698, filed Jun. 6, 2002, the entire contents of which are incorporated herein by reference.

BACKGROUND OF THE INVENTION

1. Field of the Invention

The present invention relates generally to a semiconductor device with a source line and a fabrication method thereof, and more particularly to a nonvolatile semiconductor memory device having a source line and a method of fabricating the same.

2. Description of the Related Art

A description will now be given of a conventional semiconductor device, referring, by way of example, to a NAND-type EEPROM (electrically erasable and programmable read-only memory) that is a kind of nonvolatile semiconductor memory device.

FIG. 1 is a circuit diagram of a conventional NAND-type EEPROM, FIG. 2A is a layout of the NAND-type EEPROM, and FIG. 2B is a cross-sectional view taken along line 2B—2B in the layout of FIG. 2A.

As is shown in FIG. 1, memory cell transistors M0, M1, . . . , M15 are connected in series. Select transistors SGD and SGS are connected to both ends of the series-connected memory cell transistors. A bit line BL is connected to the select transistor SGD, and a source line SL is connected to the select transistor SGS. Word lines WL0, WL1, . . . , WL15 are connected to the gate electrodes of the memory cell transistors M0 to M15, respectively. Select lines SSL and GSL are connected to the gate electrodes of the select transistors SGD and SGS, respectively.

As is shown in FIG. 2A, the word lines WL0 to WL15 and select lines SSL and GSL are arranged in parallel. The bit lines BL are arranged perpendicular to the word lines WL0 to WL15. Bit line contacts BLC are arranged between the select lines SSL.

In the NAND-type EEPROM, as shown in FIG. 2B, a plurality (16 in FIG. 2B) of memory cell transistors M0 to M15 are arranged in series between the bit line contact BLC and source line SL, with the select transistors SGD and SGS interposed.

As a structure of the source line SL in the NAND-type EEPROM, a prior-art document (Jung-Dai Choi, et al.: IEDM Tech. Dig., pp. 767–770 (2000)) discloses a source line structure (local interconnect structure) wherein impurity-doped polysilicon is buried in an insulating film, as shown in FIG. 2B.

However, the above-described conventional method has the following problems.

A first problem is a great height of the source line.

According to the fabrication method disclosed in the aforementioned document, the source line is formed to have a height that is greater than, at least, the height of the gate of the memory cell. On the other hand, in order that the source line may have a sufficiently low resistivity, it is necessary that the source line be formed to have a sufficient height. If the width of the source line decreases in accordance with device miniaturization, the source line needs to be formed with a greater height for compensation of the decrease in width.

To ensure insulation between the source line and bit line, the bit line needs to be formed at a higher position than the source line. Accordingly, the height of the bit line contact increases as the height of the source line increases, and the aspect ratio of the bit line contact increases. As a result, in the prior art, it would be difficult to achieve a satisfactory device yield.

A major factor of the above problem is the use of polysilicon as buried material for forming the source line, the polysilicon having a lower conductivity than a metal or a metal compound.

A second problem is a decrease in lithography margin, e.g. exposure latitude, occurring in a step of patterning a gate electrode. In general, a regular line-and-space pattern is desirable for ensuring a good lithography margin. In the aforementioned prior-art method, however, a wide space needs to be provided for forming the source line between the select transistors. This leads to a pattern irregularity and a decrease in lithography margin such as an exposure latitude.

BRIEF SUMMARY OF THE INVENTION

According to an aspect of the present invention, there is provided a semiconductor device comprising: a plurality of memory cell transistors, each of the plurality of memory cell transistors including a semiconductor region of a first conductivity type formed in a semiconductor substrate, a source region and a drain region of a second conductivity type formed in the semiconductor region of the first conductivity type, an information storage portion capable of electrically writing and erasing data, and at least one control gate electrode including a conductive layer; and a common source line formed on the semiconductor region of the first conductivity type, the common source line electrically connecting a plurality of the source regions of the plurality of memory cell transistors, and the common source line including a conductive layer that has a film thickness substantially equal to a film thickness of the conductive layer included in the control gate electrode and is formed of the same material as that of the conductive layer included in the control gate electrode.

According to another aspect of the invention, there is provided a method of fabricating a semiconductor device having a memory cell transistor and a source line formed adjacent to the memory cell transistor and electrically connected to the memory cell transistor, comprising: forming a first gate insulation film and a first polysilicon film in succession on a semiconductor substrate in a memory cell region where the memory cell transistor is to be formed and in a source line region where the source line is to be formed; forming a device isolation insulation film in the semiconductor substrate in the memory cell region and the source line region; removing the first polysilicon film and the first gate insulation film in the source line region; forming a second polysilicon film on the first polysilicon film, the semiconductor substrate and the device isolation insulation film in the memory cell region and the source line region; flattening the second polysilicon film, thereby exposing a surface of the device isolation insulation film; forming a second gate insulation film on the second polysilicon film and the device isolation insulation film in the memory cell region and the source line region; forming a third polysilicon film on the second gate insulation film in the memory cell region and the source line region; removing the third polysilicon film and the second gate insulation film in the source line region; forming a conductive film on the third polysilicon film in the memory cell region, and forming the conductive film on the third polysilicon film and the device isolation insulation film in the source line region; processing the first polysilicon film, the second gate insulation film, the second polysilicon film and the third polysilicon film in the memory cell region and the source line region, thus forming a gate electrode of the memory cell transistor in the memory cell region and a source line in the source line region; and implanting impurities in the semiconductor substrate between the gate electrodes of the memory cell transistors, and in the semiconductor substrate between the gate electrode and the source line, thus forming a source diffusion layer and a drain diffusion layer.

DETAILED DESCRIPTION OF THE INVENTION

Figure 1:
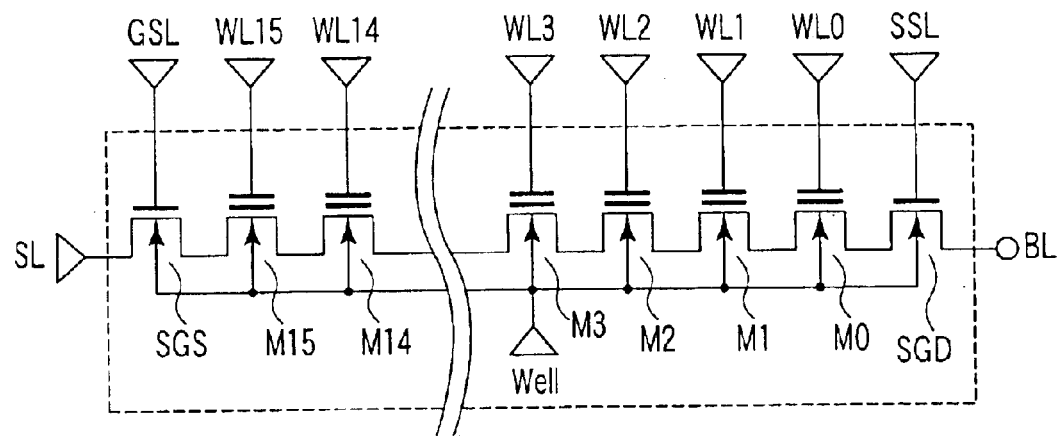
FIG. 1 is a circuit diagram showing the structure of a conventional semiconductor device.

Semiconductor devices according to embodiments of the present invention will now be described with reference to the accompanying drawings, which depict NAND-type EEPROMs by way of example. In the descriptions below, common parts are denoted by like reference numerals throughout the drawings. The semiconductor devices of the present invention, which are described below, include peripheral transistors of peripheral circuits, in addition to memory cell transistors. However, for the purpose of simplicity, the structure and fabrication method of the memory cell region will mainly be described in this specification.

[First Embodiment]

Figure 3:
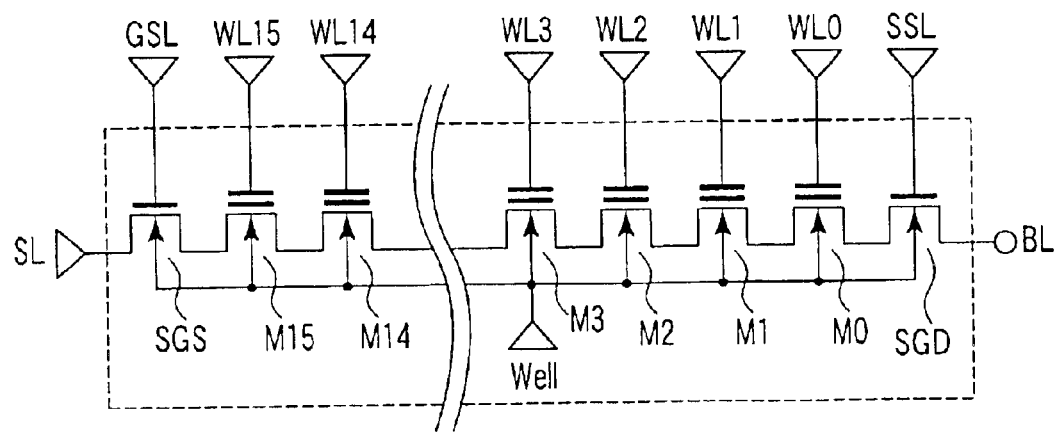
FIG. 3 is a circuit diagram showing the structure of a semiconductor device according to a first embodiment of the present invention.

FIG. 3 is a circuit diagram showing the structure of a NAND-type EEPROM according to a first embodiment of the invention.

As is shown in FIG. 3, memory cell transistors M0, M1, ..., M15, each having a control gate and a floating gate, are connected in series through their current paths. Select transistors SGD and SGS are connected to both ends of the group of the series-connected memory cell transistors.

The memory cell transistors M0, M1, ..., M15, have the control gates connected to word lines WL0, WL1, ..., WL15. The select transistor SGD has a gate connected to a select line SSL. The select transistor SGS has a control gate connected to a select line GSL. In addition, the select transistor SGD is connected to a bit line BL, and the select transistor SGS is connected to a source line SL.

A layout and a cross-sectional structure of the NAND-type EEPROM according to the first embodiment will now be described.

The NAND-type EEPROM is characterized in that the source line SL has the same stacked-layer structure as the select transistor SGD, SGS, and the memory cell, M0 to M15.

Figure 4A:
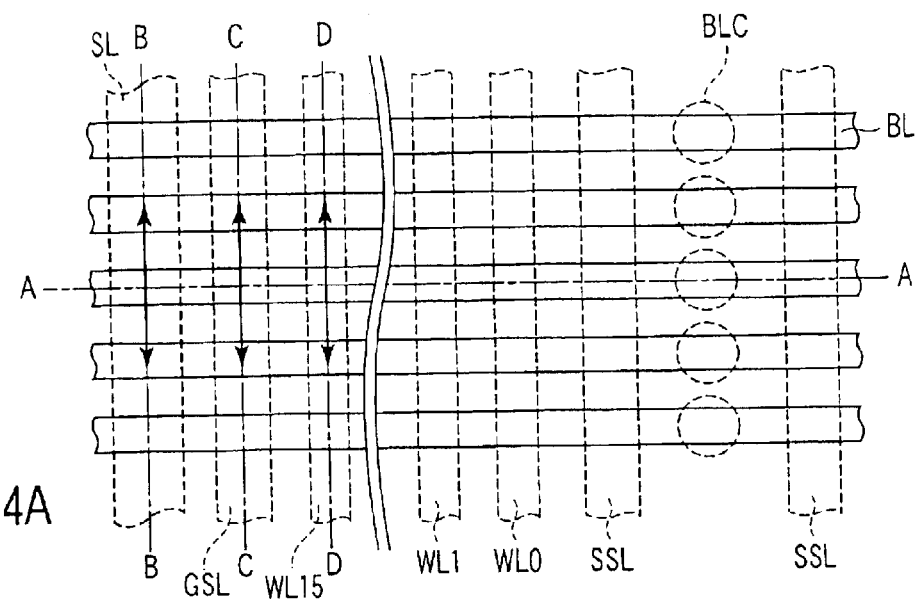
FIG. 4A is a layout of the semiconductor device of the first embodiment.

FIG. 4A is a layout of the NAND-type EEPROM according to the first embodiment.

As is shown in FIG. 4A, the word lines WL0 to WL15 are arranged in parallel. A select line SSL is arranged in parallel to the word line WL0 on the word line WL0 side of the group of the arranged word lines WL0 to WL15. In addition, another select line SSL is arranged adjacent to the select line SSL with a bit line contact BLC interposed therebetween. A select line GSL is arranged in parallel to the word line WL15 on the word line WL15 side of the group of the arranged word lines WL0 to WL15. A source line SL is arranged adjacent to the select line GSL.

Bit lines BL are arranged perpendicular to the word lines WL0 to WL15, select lines SSL and GSL, and source line SL. A bit line contact BLC for connecting the bit line BL and select transistor SGD is formed at that portion of the bit line BL, which lies between the two select lines SSL.

Figure 4B:
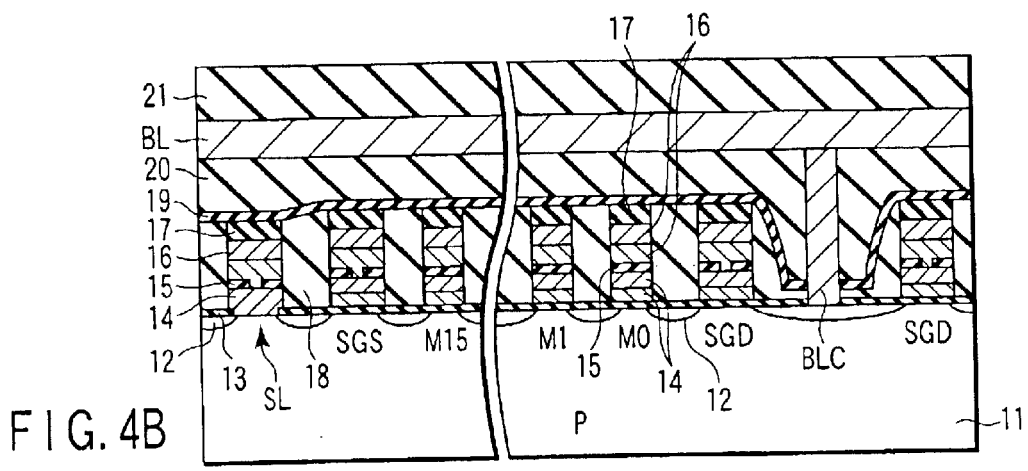
FIG. 4B is a cross-sectional view of the semiconductor device of the first embodiment, taken along line A—A in the layout of FIG. 4A.

FIG. 4B is a cross-sectional view taken along line A—A in the layout of FIG. 4A.

As is shown in FIG. 4B, n-type diffusion layers 12, which are source/drain regions, are arranged such that they are spaced apart in a p-type semiconductor substrate or a p-type well region (hereinafter referred to as "semiconductor substrate") 11. A floating gate electrode 14 is formed on that portion of the semiconductor substrate 11, which lies between the n-type diffusion layers 12, with a tunnel insulation film 13 interposed. A control gate electrode 16 is formed over the floating gate electrode 14, with an inter-poly-insulation film 15 interposed.

The floating gate electrode 14 has a thickness of, e.g. about 10 nm to 300 nm, and is formed of impurity-doped polysilicon. The control gate electrode 16 has, for example, one of the following structures: a stacked structure of tungsten silicide (WSi) and polysilicon; a stacked structure of a metal compound of silicon, such as NiSi, MoSi, TiSi or CoSi, and polysilicon; a stacked structure of a metal, such as W, Cu or Al, and polysilicon; and a single-layer structure of a metal compound of silicon, or a metal. The control gate electrode 16 has a thickness of, e.g. about 10 nm to 300 nm.

A cap insulation film 17 is formed on the control gate electrode 16. The cap insulation film 17 is formed of a silicon oxide film or a silicon nitride film with a thickness of about 10 nm to 300 nm.

Thereby, both ends of the current paths of memory cell transistors M0 to M15 are connected to constitute a NAND cell. The control gate electrodes 16 of memory cell transistors M0 to M15 correspond to word lines WL0 to WL15.

A select transistor SGD, comprising the tunnel insulation film 13, floating gate electrode 14, inter-poly-insulation film 15 and control gate electrode 16, is formed at one end of the NAND cell. A select transistor SGD of another block is formed at one end of this select transistor SGD, with an n-type diffusion layer 12 and a bit line contact BLC interposed therebetween.

At the other end of the NAND cell, a select transistor SGS is formed, which comprises the tunnel insulation film 13, floating gate electrode 14, inter-poly-insulation film 15 and control gate electrode 16. Further, a source line SL is formed at one end of the select transistor SGS.

A portion of the inter-poly-insulation film 15 in the select transistor SGD, SGS is removed so as to establish electrical conduction between the floating gate electrode 14 and control gate electrode 16. Thus, the floating gate electrode 14 and control gate electrode 16 of the select transistor SGD correspond to the select line SSL, and the floating gate electrode 14 and control gate electrode 16 of the select transistor SGS correspond to the select line GSL.

Figure 4C:
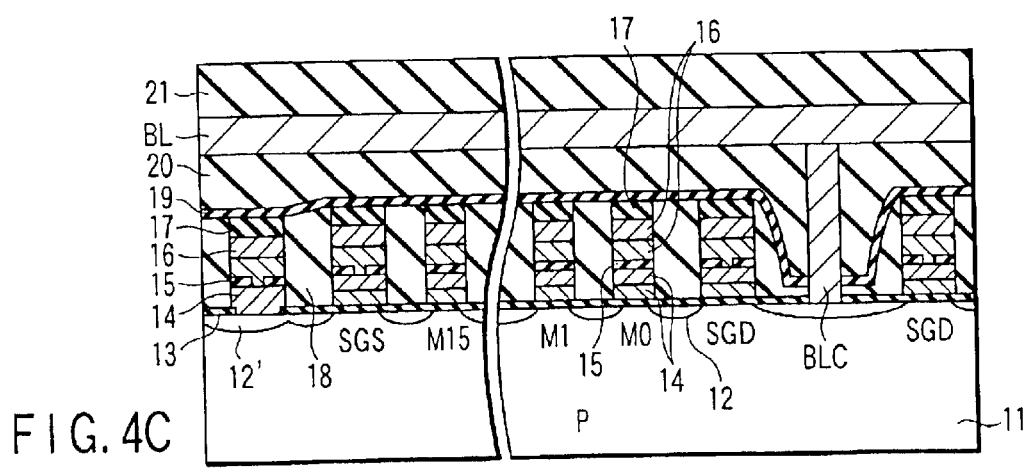
FIG. 4C is a cross-sectional view of a semiconductor device according to another example of the first embodiment, taken along line A—A in the layout of FIG. 4A.

The source line SL has a cross-sectional structure as described below. In the semiconductor substrate 11, n-type diffusion layers 12 are formed spaced apart. Alternatively, as shown in FIG. 4C, an n-type diffusion layer 12' may be formed under the source line SL. A tunnel insulation film 13 is formed on the semiconductor substrate 11 and n-type diffusion layer 12. A portion or the entirety of the tunnel insulation film 13 is removed from a region on the semiconductor substrate 11 (or n-type diffusion layer 12'), where the source line is to be formed between the n-type diffusion layers 12, and from a region on the n-type diffusion layer 12.

A conductive film 14, which is formed of the same conductive material as that of the floating gate electrode 14 in the same layer as the floating gate electrode 14, is formed on the semiconductor substrate 11 (or n-type diffusion layer 12') and n-type diffusion layer 12, from where the tunnel insulation film 13 has been removed. Thereby, the conductive film 14 is electrically connected to the semiconductor substrate 11 and n-type diffusion layer 12. The conductive film 14, like the floating gate electrode 14, has a thickness of, e.g. about 10 nm to 300 nm and is formed of impurity-doped polysilicon.

An inter-poly-insulation film 15 such as an ONO film is formed on the conductive film 14. A conductive film 16, which is formed of the same conductive material as that of the control gate electrode 16 in the same layer as the control gate electrode 16, is formed on the inter-poly-insulation film 15. The inter-poly-insulation film 15 is formed of the same material as that of the inter-poly-insulation film 15 of the memory cell in the same layer as the inter-poly-insulation film 15 of the memory cell. A portion of the inter-poly-insulation film 15 on the conductive film 14 is removed so as to establish electrical conduction between the conductive film 14 and conductive film electrode 16. As a result, the conductive film 14 and conductive film 16 are electrically connected to the semiconductor substrate 11 and n-type diffusion layer 12 and function as the source line of the nonvolatile memory cell. The source line is formed of the same layer materials as the select line SSL, GSL and the word line, WL0 to WL15.

A cap insulation film 17, which is formed of the same material in the same layer as the cap insulation film 17 of each memory cell and each select transistor, is formed on the conductive film 16.

As has been described above, the conductive film 16 is formed in the same layer as the control gate electrode 16, that is, in the same layer as the control gate electrode (word line) 16 of each memory cell, M0 to M15, and the control gate electrode 16 of the select transistor SGD, SGS. The conductive film 16, like the control gate electrode 16, has, for example, one of the following structures: a stacked structure of tungsten silicide (WSi) and polysilicon; a stacked structure of a metal compound of silicon, such as NiSi, MoSi, TiSi or CoSi, and polysilicon; a stacked structure of a metal, such as W, Cu or Al, and polysilicon; and a single-layer structure of a metal compound of silicon, or a metal. The conductive film 16 has a thickness of, e.g. about 10 nm to 300 nm.

The height of the conductive film 16 of the source line SL, as measured from the surface of the semiconductor substrate 11, is determined by the height of the control gate electrode 16 of each memory cell and each select transistor, as measured from the surface of the semiconductor substrate 11. Specifically, the height of the conductive film 16 is set to be equal to the height of the control gate electrode 16, and preferably less than the height of the control gate electrode 16 by about 10 nm to 100 nm.

Interlayer insulation films 18 are formed between the gate electrodes (floating gate electrodes 14 and control gate electrodes 16) of the memory cell transistors M0 to M15 and select transistors SGD and SGS, between the gate electrode and the source line SL, and between the source lines SL. A barrier insulation film 19 is formed on the cap insulation films 17 and interlayer insulation films 18 so as to cover the memory cell transistors, select transistors and source line. The barrier insulation film 19 is formed of, e.g. a silicon nitride film about 5 nm to 50 nm thick. A bit line BL is formed over the barrier insulation film 19, with an interlayer insulation film 20 interposed.

A bit line contact BLC is formed on the n-type diffusion layer 12 between the select transistors SGD. The bit line contact BLC electrically connects the n-type diffusion layer 12 and bit line BL.

The barrier insulation film 19 serves as an etching stopper film that prevents the bit line contact BLC from sinking in the device isolation groove. The bit line contact BLC is formed higher than the source line SL. Thereby, insulation is ensured between the source line SL and bit line BL.

A fabrication method of the semiconductor device according to the first embodiment will now be described.

FIGS. 5A to 5E, FIGS. 6A to 6D, FIGS. 7A to 7D, FIGS. 8A to 8D, FIGS. 9A to 9D, FIGS. 10A to 10D, FIGS. 11A to 11D and FIGS. 12 to 14 are cross-sectional views illustrating the fabrication method of the semiconductor device according to the first embodiment.

Figure 5A:
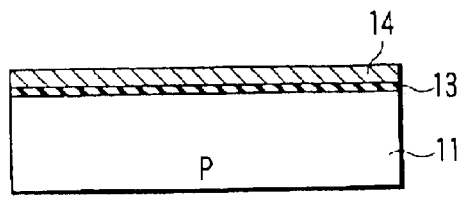
FIGS. 5A to 5E are cross-sectional views illustrating a first step in a method of fabricating the semiconductor device of the first embodiment.

FIG. 5A is a cross-sectional view of a NAND-type EEPROM, taken in a direction perpendicular to the device isolation groove. That is, FIG. 5A is a cross-sectional view taken along line B—B in the layout of FIG. 4A, which extends along the source line region, line C—C extending along the select transistor region, and line D—D extending along the memory cell region. The cross-sectional structures along line B—B, line C—C and line D—D are common in the fabrication steps from the formation of the tunnel insulation film 13 to the formation of device isolation insulation films, and therefore FIG. 5A is used to commonly represent these structures. Similarly, FIGS. 5B to 5E are cross-sectional views taken along lines B—B, C—C and D—D. FIGS. 5A to 5E show cross-sectional structures of regions indicated by double-headed arrows in FIG. 4A. Similarly, the cross-sectional structures of regions indicated by double-headed arrows in FIG. 4A are illustrated in FIGS. 6A to 6D, FIGS. 7A to 7D, FIGS. 8A to 8D, FIGS. 9A to 9D, FIGS. 10A to 10D, FIGS. 11A to 11D.

Impurities for forming wells and channels are implanted in the semiconductor substrate 11. As is shown in FIG. 5A, a tunnel insulation film 13 with a thickness of about 5 nm to 15 nm is formed on the semiconductor substrate 11. The tunnel insulation film 13 is formed of, e.g. an oxide film or an oxinitride film. A polysilicon film 14 with a thickness of about 10 nm to 200 nm is formed on the tunnel insulation film 13.

Figure 5B:
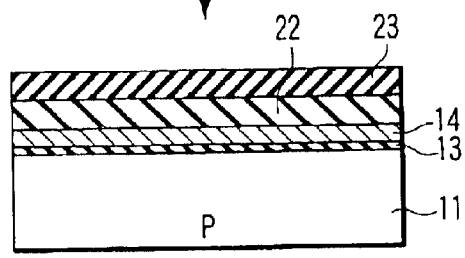

Subsequently, as shown in FIG. 5B, a stopper insulation film 22 is formed on the polysilicon film 14. A mask insulation film 23 is formed on the stopper insulation film 22. The stopper insulation film 22 is formed of, e.g. a silicon nitride film about 20 nm to 200 nm thick. The mask insulation film 23 is formed of, e.g. a silicon oxide film about 50 nm to 200 nm thick. The stopper insulation film 22 serves as a stopper film in a CMP step that is performed later.

Figure 5C:
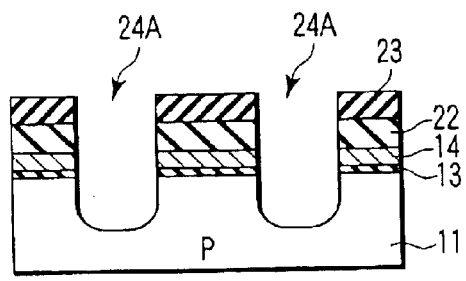

Then, a resist film is patterned by photolithography. Using the patterned resist film and mask insulation film 23 as a mask, anisotropic etching is performed, as illustrated in FIG. 5C, thus forming device isolation grooves 24A in the semiconductor substrate 11.

Figure 5D:
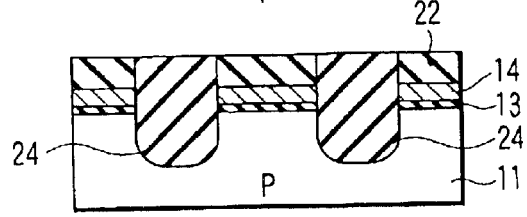
Figure 5E:
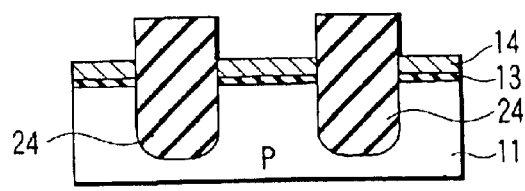
Figure 6A:
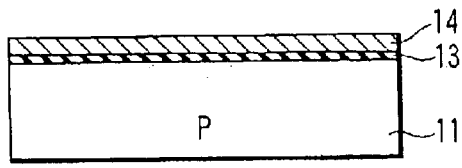
FIGS. 6A to 6D are cross-sectional views illustrating a second step in the method of fabricating the semiconductor device of the first embodiment.
Figure 6B:
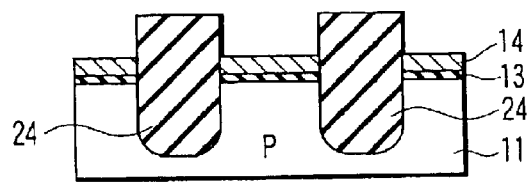
Figure 6C:
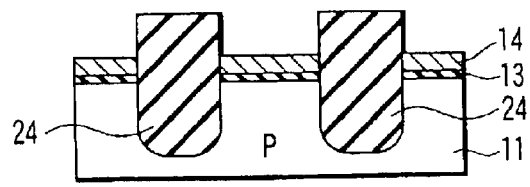
Figure 6D:
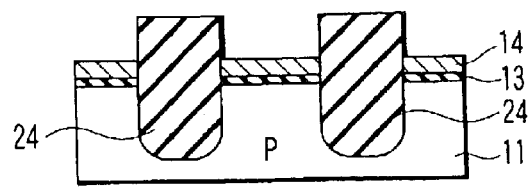

The device isolation grooves 24A are filled with insulation films 24 such as silicon oxide films. The insulation films 24 are flattened by CMP, as shown in FIG. 5D. Further, as shown in FIG. 5E, the stopper insulation film 22 is removed by wet etching. FIGS. 6A to 6D are cross-sectional views in which the device isolation regions have been formed by the above process.

Figure 11A:
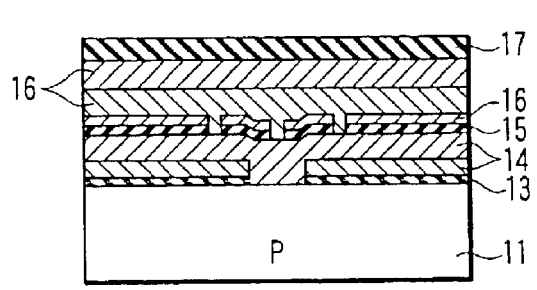
FIGS. 11A to 11D are cross-sectional views illustrating a seventh step in the method of fabricating the semiconductor device of the first embodiment.
Figure 11C:
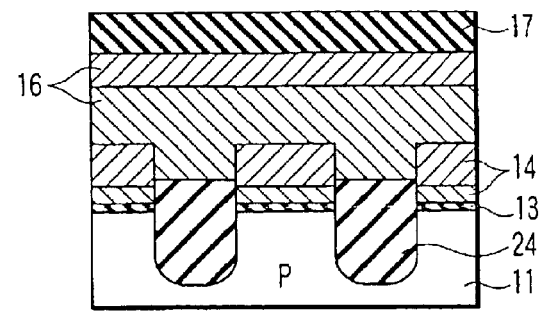
Figure 11B:
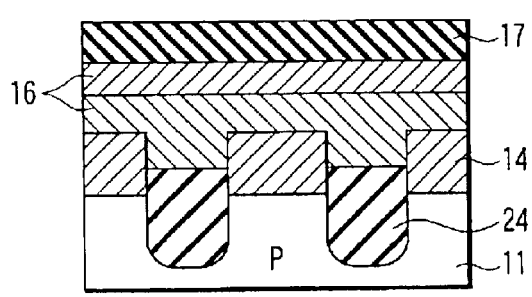
Figure 11D:
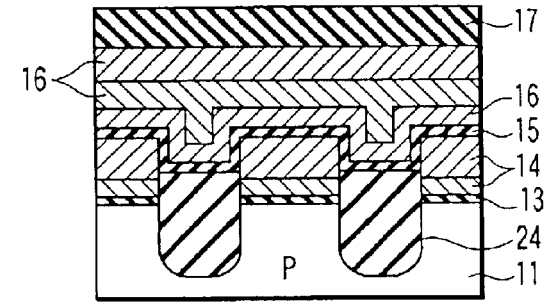
Figure 12:
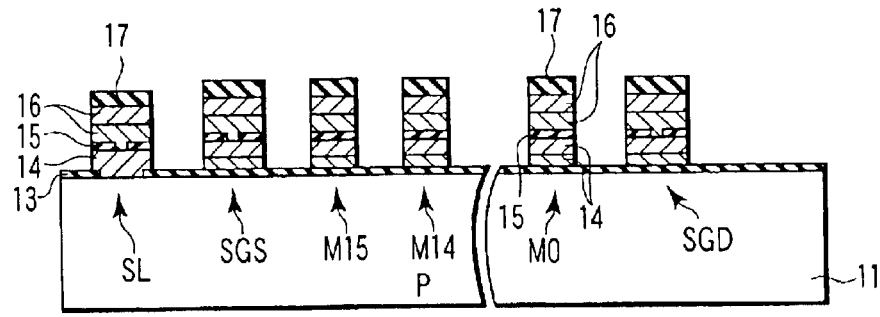
FIG. 12 is a cross-sectional view illustrating an eighth step in the method of fabricating the semiconductor device of the first embodiment.
Figure 13:
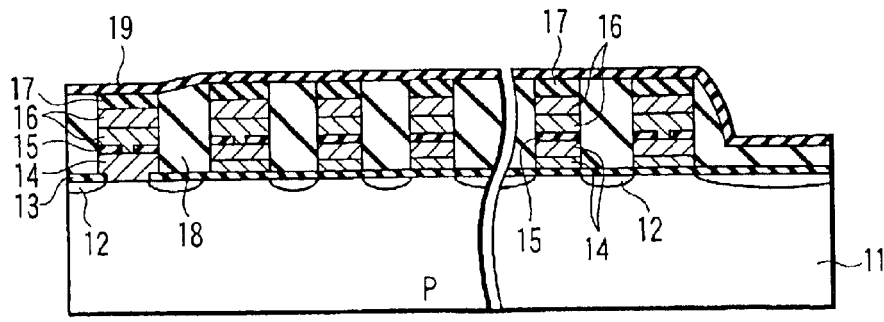
FIG. 13 is a cross-sectional view illustrating a ninth step in the method of fabricating the semiconductor device of the first embodiment.
Figure 14:
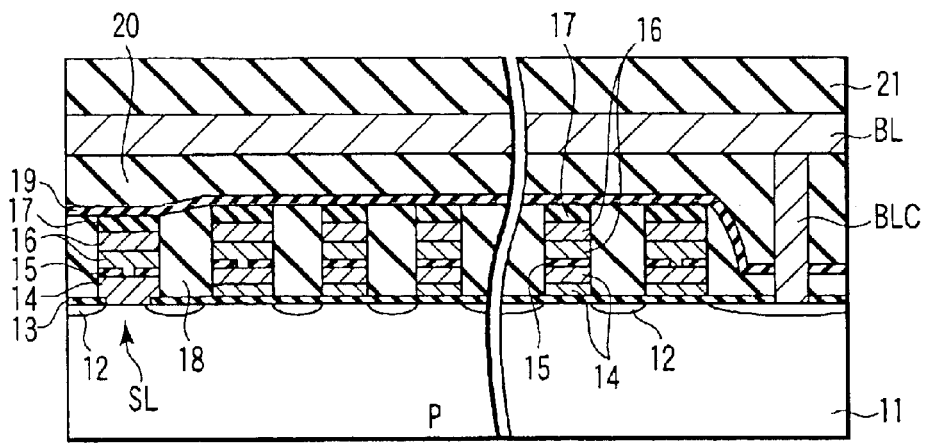
FIG. 14 is a cross-sectional view illustrating a tenth step in the method of fabricating the semiconductor device of the first embodiment.

FIG. 6A, FIG. 7A, FIG. 8A, FIG. 9A, FIG. 10A, FIG. 11A and FIGS. 12 to 14 are cross-sectional views taken along line A—A perpendicular to the word lines. FIGS. 6A to 11A show cross-sectional structures of the source line and the select transistor regions arranged on both sides of the source line. FIGS. 12 to 14 are cross-sectional views of a NAND memory cell block including the source line and bit line contact. FIG. 6B, FIG. 7B, FIG. 8B, FIG. 9B, FIG. 10B and FIG. 11B are cross-sectional views taken along line B—B that extends along the source region. FIG. 6C, FIG. 7C, FIG. 8C, FIG. 9C, FIG. 10C and FIG. 11C are cross-sectional views taken along line C—C that extends along the select transistor region. FIG. 6D, FIG. 7D, FIG. 8D, FIG. 9D, FIG. 10D and FIG. 11D are cross-sectional views taken along line D—D that extends along the memory cell region.

Figure 7A:
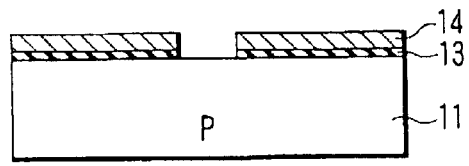
FIGS. 7A to 7D are cross-sectional views illustrating a third step in the method of fabricating the semiconductor device of the first embodiment.
Figure 7B:
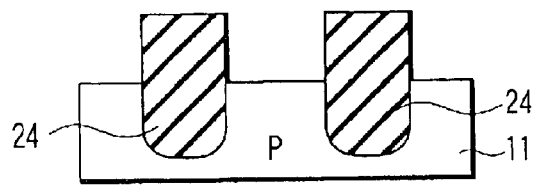
Figure 7C:
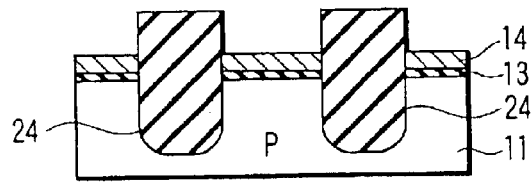
Figure 7D:
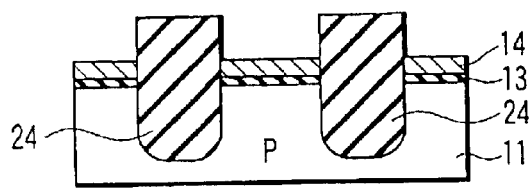
Figure 8A:
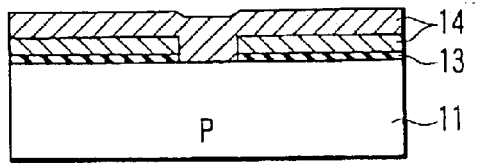
FIGS. 8A to 8D are cross-sectional views illustrating a fourth step in the method of fabricating the semiconductor device of the first embodiment.
Figure 8B:
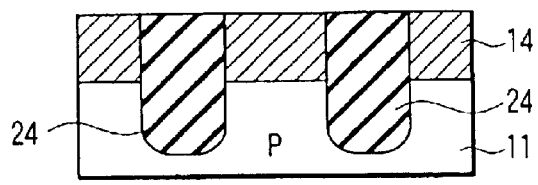
Figure 8C:
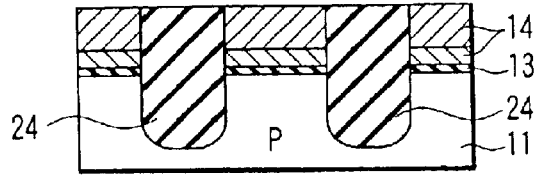
Figure 8D:
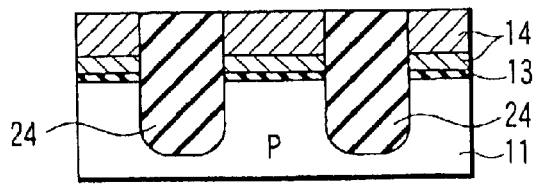
Figure 9A:
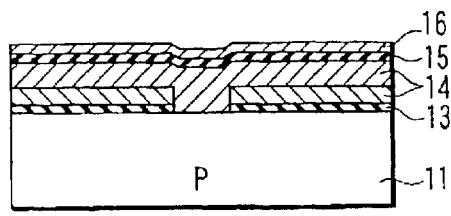
FIGS. 9A to 9D are cross-sectional views illustrating a fifth step in the method of fabricating the semiconductor device of the first embodiment.
Figure 10A:
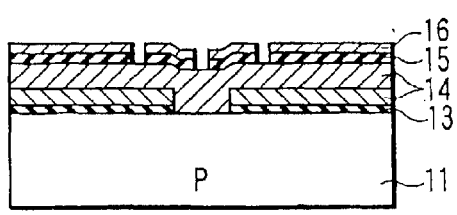
FIGS. 10A to 10D are cross-sectional views illustrating a sixth step in the method of fabricating the semiconductor device of the first embodiment.
Figure 9B:
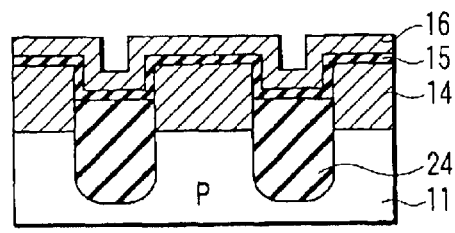
Figure 10B:
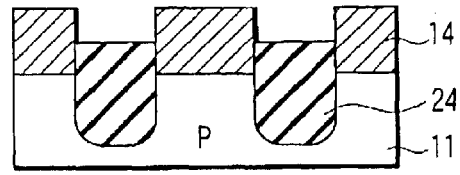
Figure 9C:
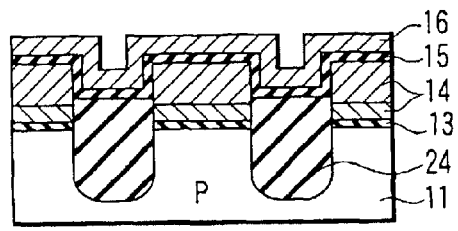
Figure 10C:
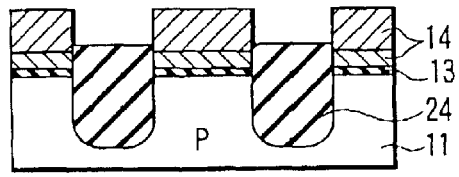
Figure 9D:
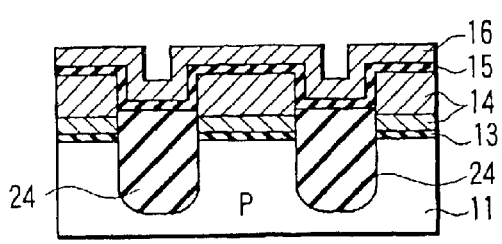
Figure 10D:
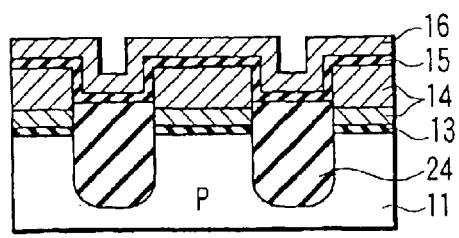

Following the above-described step, a resist film is patterned by photolithography. Using the patterned resist film as a mask, as shown in FIGS. 7A and 7B, anisotropic etching is performed to remove the polysilicon film 14 and tunnel insulation film 13 in the source line region. In this step, there is a case where upper portions of the device isolation insulation films in the source line region may also be etched away. Further, if impurities such as phosphorus or arsenic are implanted in the semiconductor substrate, an n-type diffusion layer may be formed at an interface between the source line and the semiconductor substrate, as shown in FIG. 4C.

An impurity-heavily-doped polysilicon film 14 with a thickness of about 10 nm to 300 nm is deposited on the polysilicon film 14, semiconductor substrate 11 and device isolation insulation films 24, which are shown in FIGS. 7A to 7D. Then, as shown in FIGS. 8A to 8D, the deposited polysilicon film 14 is flattened by CMP.

Subsequently, after the device isolation insulation films 24 are recessed, an inter-poly-insulation film 15 is formed on the polysilicon film 14 and device isolation insulation films 24, as shown in FIGS. 9A to 9D. The inter-poly-insulation film 15 comprises, e.g. an ONO film in which an oxide film, a nitride film and an oxide film are stacked in the named order. An impurity-heavily-doped polysilicon film 16 with a thickness of about 10 nm to 100 nm is formed on the inter-poly-insulation film 15.

Then, using a photolithographically patterned resist film as a mask, as illustrated in FIGS. 10A to 10D, anisotropic etching is carried out to remove portions or the entirety of the polysilicon film 16 and inter-poly-insulation film 15 in the source line region and select transistor region.

Thereafter, as shown in FIGS. 11A to 11D, a conductive film 16 with a thickness of about 10 nm to 300 nm is formed on the structure shown in FIGS. 10A to 10D. The conductive film 16 has, for example, one of the following structures: a stacked structure of tungsten silicide (WSi) and polysilicon; a stacked structure of a metal compound of silicon, such as NiSi, MoSi, TiSi or CoSi, and polysilicon; a stacked structure of a metal, such as W, Cu or Al, and polysilicon; and a single-layer structure of a metal compound of silicon, or a metal. A cap insulation film 17 is formed on the conductive film 16.

In the source region and select transistor region, as shown in FIGS. 11B and 11C, part or all of the inter-poly-insulation film 15 is removed. Accordingly, the polysilicon film 14 forming the floating gate electrode and the conductive film 16 forming the control gate electrode are electrically connected.

Following the above step, using a photolithographically patterned resist film and cap insulation film 17 as a mask, anisotropic etching is carried out to process the gate electrodes of the memory cell transistors M0 to M15 and select transistors SGD and SGS and the source line SL, as shown in FIG. 12.

Then, as shown in FIG. 13, impurities such as phosphorus or arsenic are implanted in the semiconductor substrate 11 between the gate electrodes of the memory cell transistors and select transistors and between the gate electrode and source line SL, thereby forming n-type diffusion layers 12 that are source/drain regions. In addition, interlayer insulation films 18 such as silicon oxide films are filled in between the gate electrodes and between the gate electrode and source line.

Next, a barrier insulation film 19, which is, e.g. about 5 nm to 50 nm thick, is formed on the gate electrodes of the memory cell transistors and select transistors, the source line SL and the interlayer insulation films 18.

Then, as shown in FIG. 14, an interlayer insulation film 20 such as a silicon oxide film is deposited, and the interlayer insulation film 20 is flattened by CMP. Further, a bit line contact BLC connected to the n-type diffusion layer 12 is formed in the interlayer insulation film 20. A bit line BL is formed on the bit line contact BLC and interlayer insulation film 20. An insulation film 21 is formed over the bit line BL and interlayer insulation film 20.

Subsequently, although not illustrated, upper wiring, a passivation film, etc. are formed to complete fabrication of the NAND-type EEPROM.

In the semiconductor device with the above structure and the fabrication method, the source line SL is formed of the material having a higher conductivity than polysilicon, as mentioned above. Thus, the source line resistivity can be made lower than in the conventional semiconductor device shown in FIG. 2B. Hence, the height of the source line can be decreased. Thereby, the bit line BL can also be formed lower than in the conventional semiconductor device, and the aspect ratio of the bit line contact BLC can be reduced. As a result, the processing of the semiconductor device can be facilitated, and the device yield is increased.

In the above-described fabrication method, the source line SL is formed in the same step as the step of forming the gate electrodes of the memory cell transistors and select transistors. This makes it unnecessary to provide a margin for alignment between the select transistor and source line, and reduces the space between the select transistors, compared to the prior art. Hence, the area of the NAND-type EEPROM can be reduced.

The source line SL is formed of the same material, and in the same layer, as the gate electrode of each of the memory cell transistors and select transistors. Therefore, compared to the prior-art semiconductor device fabrication method wherein the formation of the source line is performed in a separate process, the number of fabrication steps can be reduced and the manufacturing cost of the semiconductor device can be reduced. Furthermore, the design of circuitry is easier since the resistivity of the source line becomes substantially equal to that of the select line SGD, SGS, or the word line, WL0 to WL15.

Figure 15:
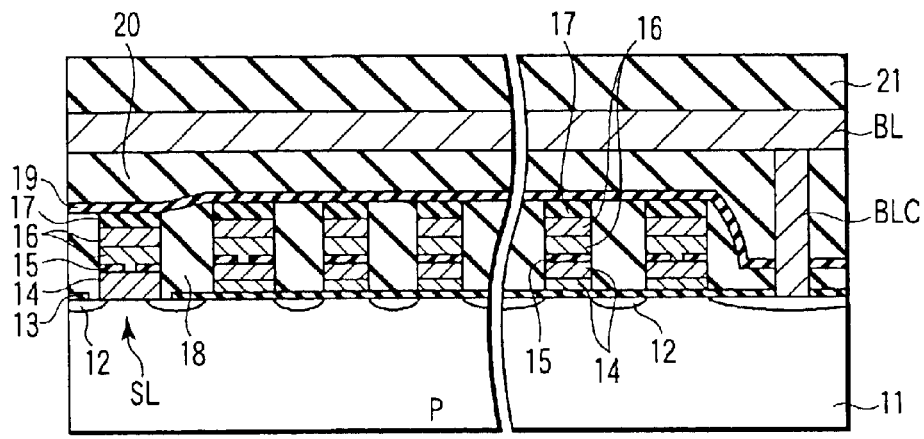
FIG. 15 is a cross-sectional view showing the structure of a semiconductor device according to a modification of the first embodiment.

In the above-described first embodiment, as shown in FIG. 14, the size of the opening in the tunnel insulation film 13 on the semiconductor substrate 11 is smaller than the bottom surface area of the polysilicon film 14 of the source line SL in the contact region between the source line SL and semiconductor substrate 11. However, as shown in FIG. 15, the size of the opening in the tunnel insulation film 13 may be greater than the bottom surface area of the polysilicon film 14.

The operation of the NAND-type EEPROM according to the first embodiment will now be described.

In an erase operation, for example, a high voltage (e.g. 10 V to 25 V) is applied to the semiconductor substrate 11 in the state in which the control gate electrode 16 is set at 0 V. Thereby, electrons are released from the floating gate electrode (i.e. charge accumulation layer) 14 to the semiconductor substrate 11, and the erase operation is effected.

In a write operation, for example, a high voltage (e.g. 10 V to 25 V) is applied to the control gate electrode 16 in the state in which the semiconductor substrate 11 is set at 0 V. Thereby, electrons are injected from the semiconductor substrate 11 into the floating gate electrode 14, and the write operation is effected. In another method, hot electrons, which are accelerated in the channel, are produced by positively biasing the drain potential relative to the source potential. In addition, by positively biasing the control gate electrode 16 relative to the source potential, the hot electrons are injected in the floating gate electrode 14. Thus, the write operation is effected.

In a read-out operation, the bit line BL is precharged and then set in a floating state. The voltage of the control gate electrode 16 of the memory cell selected for read-out is set at 0 V, and the voltage of the control gate electrodes of the other memory cell transistors is set at a non-selected readout voltage Vread. Further, the voltage of the control gate electrode 16 of the select transistor SGS, SGD is set at a power supply voltage Vcc, and the source line SL is set at 0 V. Whether current flows in the memory cell selected for read-out is detected by the bit line BL. Thus, the read-out operation is effected. Specifically, if the selected memory cell is at a threshold voltage Vth>0 (write state), the memory cell is in the off state and the bit line BL maintains a precharge potential.

On the other hand, if the selected memory cell is at a threshold voltage Vth<0 (read state), the memory cell is turned on, and the potential of the bit line BL lowers from the precharge potential by ΔV. This potential change is sensed by a sense amplifier, and the data in the memory cell is read out.

As has been described above, in the first embodiment, it is possible to prevent an increase in height of the source line and to thus prevent an increase in the aspect ratio of the bit line contact. Moreover, it is possible to suppress a decrease in lithography margin in the step of patterning the gate electrode. Besides, since the source line is formed at the same time as the select transistors and memory cell transistors, the number of fabrication steps can be reduced.

[Second Embodiment]

A semiconductor device according to a second embodiment of the present invention will now be described.

The second embodiment differs from the first embodiment in that the gate electrode of each of the memory cell transistors and select transistors has a single-layer structure without an inter-poly-insulation film. Similarly, the source line does not include an inter-poly-insulation film. Further, each of the memory cell transistors and select transistors has a MONOS (Metal-Oxide-Nitride-Oxide-Semiconductor) structure. Structural parts common to those of the first embodiment are denoted by like reference numerals, and a description thereof is omitted. Only different parts will be described.

Figure 16:
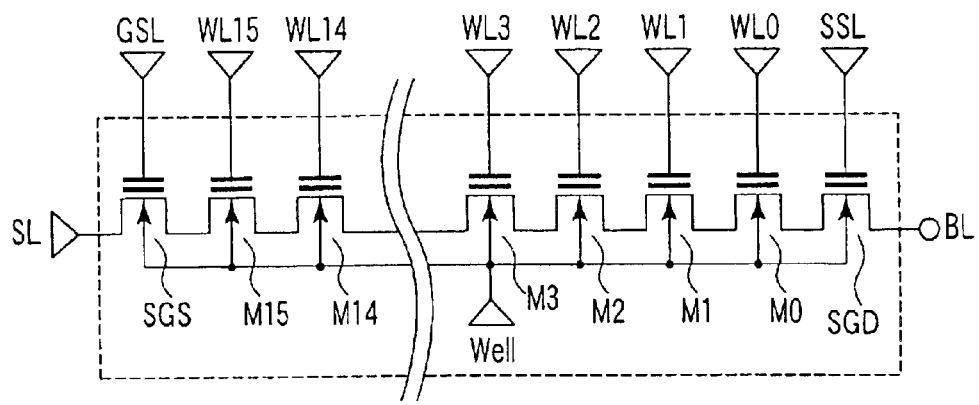
FIG. 16 is a circuit diagram showing the structure of a semiconductor device according to a second embodiment of the present invention.
Figure 17A:
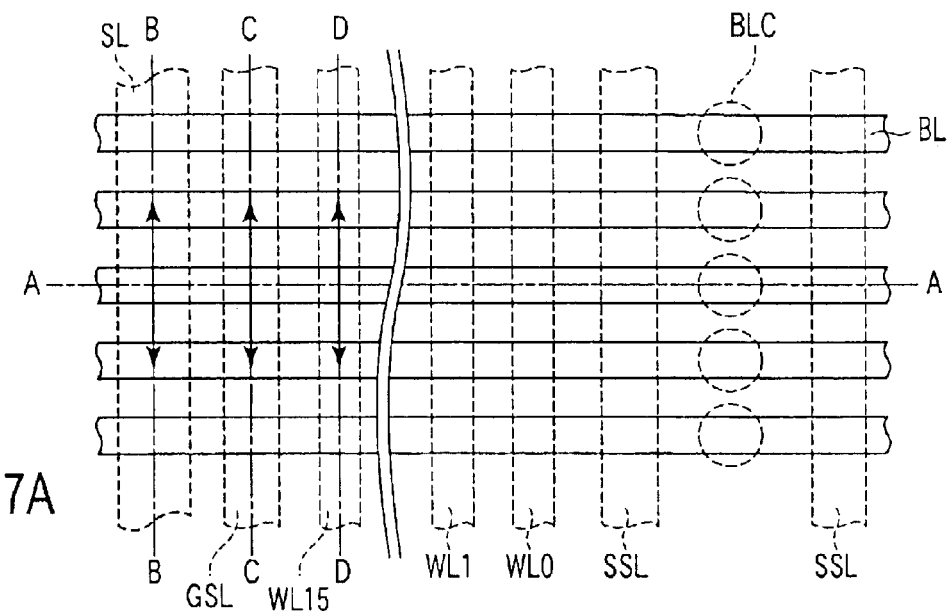
FIG. 17A is a layout of the semiconductor device of the second embodiment.
Figure 17B:
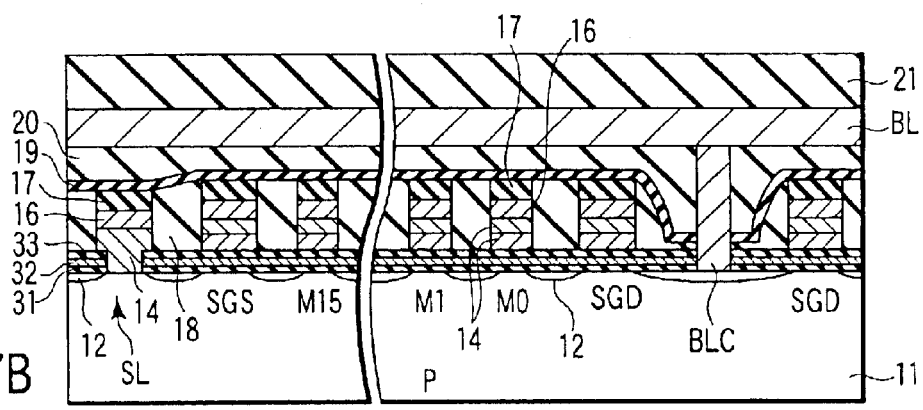
FIG. 17B is a cross-sectional view of the semiconductor device of the second embodiment, taken along line A—A in the layout of FIG. 17A.

FIG. 16 is a circuit diagram showing the structure of a NAND-type EEPROM according to the second embodiment of the invention. FIG. 17A is a layout of the NAND-type EEPROM according to the second embodiment. FIG. 17B is a cross-sectional view taken along line A—A in the layout of FIG. 17A. The layout in FIG. 17A is the same as that of the first embodiment.

As is shown in FIG. 17B, a gate insulation film of each of the memory cell transistors and select transistors, which is formed on the semiconductor substrate 11, has a stacked-layer structure comprising a tunnel insulation film 31, a charge accumulation layer 32 and a block insulation film 33 which are stacked in the named order. Each of the memory cell transistors and select transistors has a so-called MONOS (Metal-Oxide-Nitride-Oxide-Semiconductor) structure. The tunnel insulation film 31 is formed of a silicon oxide film, a silicon oxinitride film or a silicon nitride film, with a thickness of, e.g. about 1 nm to 10 nm. The charge accumulation layer 32 is formed of a silicon nitride film with a thickness of, e.g. about 3 nm to 30 nm. The block insulation film 33 is formed of a silicon nitride film, a silicon oxinitride film or a silicon nitride film, with a thickness of, e.g. about 3 nm to 20 nm.

The gate electrode of each of the memory cell transistors and select transistors comprises a polysilicon film 14 formed on the gate insulation film, and a conductive film 16 formed on the polysilicon film 14. The polysilicon film 14 has a thickness of about 10 nm to 200 nm. The conductive film 16 has, for example, one of the following structures: a stacked structure of tungsten silicide (WSi) and polysilicon; a stacked structure of a metal compound of silicon, such as NiSi, MoSi, TiSi or CoSi, and polysilicon; a stacked structure of a metal, such as W, Cu or Al, and polysilicon; and a single-layer structure of a metal compound of silicon, or a metal. The conductive film 16 has a thickness of, e.g. about 10 nm to 300 nm.

Figure 17C:
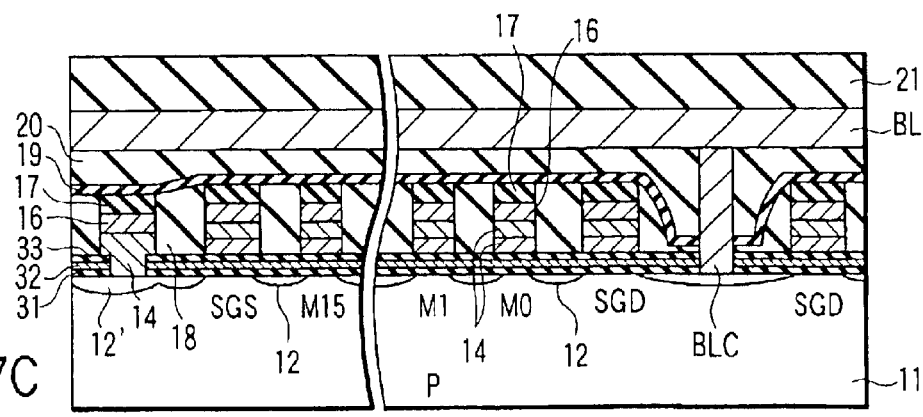
FIG. 17C is a cross-sectional view of a semiconductor device according to another example of the second embodiment, taken along line A—A in the layout of FIG. 17A.

In the region of the source line SL, a portion or the entirety of the gate insulation film comprising the tunnel insulation film 31, charge accumulation layer 32 and block insulation film 33, which is formed on the semiconductor substrate 11, is etched away. Thus, a polysilicon film 14 and a conductive film 16, which are formed of the same material as that of the aforementioned gate electrode, are formed on the n-type diffusion layer 12 and semiconductor substrate 11. The polysilicon film 14 and conductive film 16 constitute the source line and are electrically connected to the n-type diffusion layer 12. Alternatively, as shown in FIG. 17C, an n-type diffusion layer 12' may be formed under the source line SL. As a result, the conductive film 14 and conductive film 16 are electrically connected to the semiconductor substrate 11 and n-type diffusion layer 12' and function as the source line of the nonvolatile memory cell. The source line is formed of the material of the same layer as the select line SSL, GSL and word line, WL0 to WL15.

Further, as shown in FIG. 17B, a cap insulation film 17, an interlayer insulation film 18, a barrier insulation film 19, an interlayer insulation film 20, a bit line contact BLC, a bit line BL and an insulation film 21 are formed.

In the NAND-type EEPROM shown in FIGS. 16 and 17B, the select transistors SGD and SGS have the same MONOS structure as the memory cell transistors, but they may have a MOS structure. In the case where the select transistors have the MOS structure, the conductive material of the source line is formed in the same fabrication step, and in the same layer, as the conductive material of the select transistor. In addition, the insulation film between the semiconductor substrate and the conductive material in the source line region is formed in the same fabrication step, and in the same layer, as the insulation film of the select transistor.

A fabrication method of the semiconductor device according to the second embodiment will now be described.

FIGS. 18A to 18E, FIGS. 19A to 19C, FIGS. 20A to 20C, FIGS. 21A to 21C, FIGS. 22A to 22C, and FIGS. 23 to 25 are cross-sectional views illustrating the fabrication method of the semiconductor device according to the second embodiment.

Figure 18A:
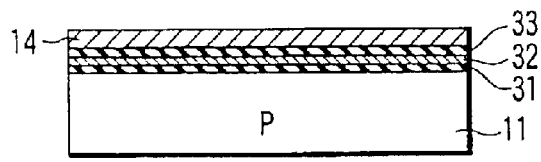
FIGS. 18A to 18E are cross-sectional views illustrating a first step in a method of fabricating the semiconductor device of the second embodiment.

FIG. 18A is a cross-sectional view of a NAND-type EEPROM, taken in a direction perpendicular to the device isolation groove. That is, FIG. 18A is a cross-sectional view taken along line B—B in the layout of FIG. 17A, which extends along the source line region, line C—C extending along the select transistor region, and line D—D extending along the memory cell region. The cross-sectional structures along line B—B, line C—C and line D—D are common in the fabrication steps from the formation of the tunnel insulation film 31 to the formation of device isolation insulation films, and therefore FIG. 18A is used to commonly represent these structures. Similarly, FIGS. 18B to 18E are cross-sectional views taken along lines B—B, C—C and D—D.

Impurities for forming wells and channels are implanted in the semiconductor substrate 11. As is shown in FIG. 18A, a gate insulation film comprising a tunnel insulation film 31, a charge accumulation layer 32 and a block insulation film 33, which are stacked in the named order, is formed on the semiconductor substrate 11. The tunnel insulation film 31 is formed of a silicon oxide film, a silicon oxinitride film or a silicon nitride film, with a thickness of, e.g. about 1 nm to 10 nm. The charge accumulation layer 32 is formed of a silicon nitride film with a thickness of, e.g. about 3 nm to 30 nm. The block insulation film 33 is formed of a silicon nitride film, a silicon oxinitride film or a silicon nitride film, with a thickness of, e.g. about 3 nm to 20 nm. Then, the semiconductor substrate 11 with the gate insulation film formed is annealed, where necessary, thereby to densify the gate insulation film.

Subsequently, a polysilicon film 14 with a thickness of about 10 nm to 200 nm is formed on the block insulation film 33.

Figure 18B:
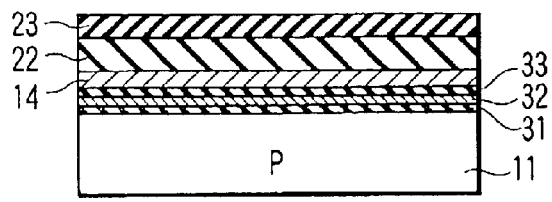

As shown in FIG. 18B, a stopper insulation film 22 is formed on the polysilicon film 14. A mask insulation film 23 is formed on the stopper insulation film 22. The stopper insulation film 22 is formed of, e.g. a silicon nitride film about 20 nm to 200 nm thick. The mask insulation film 23 is formed of, e.g. a silicon oxide film about 50 nm to 200 nm thick. The stopper insulation film 22 serves as a stopper film in a CMP step that is performed later.

Figure 18C:
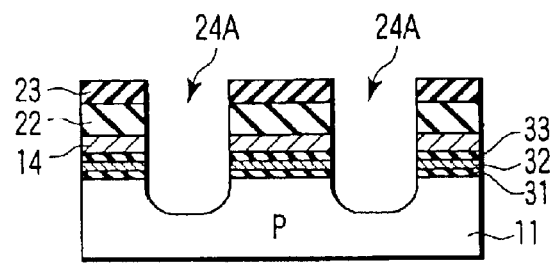

Then, a resist film is patterned by photolithography. Using the patterned resist film and mask insulation film 23 as a mask, anisotropic etching is performed, as illustrated in FIG. 18C, thus forming device isolation grooves 24A in the semiconductor substrate 11.

Figure 19A:
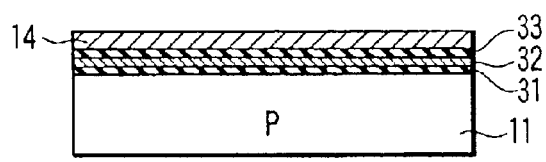
FIGS. 19A to 19C are cross-sectional views illustrating a second step in the method of fabricating the semiconductor device of the second embodiment.
Figure 19B:
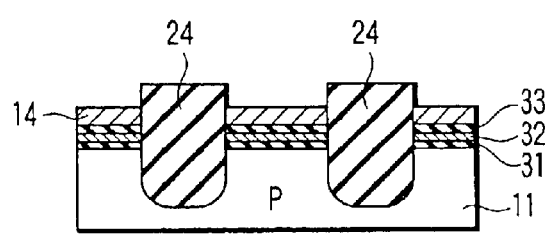
Figure 18D:
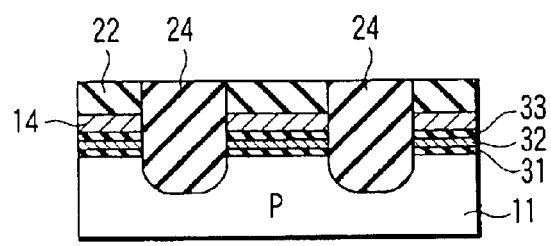
Figure 19C:
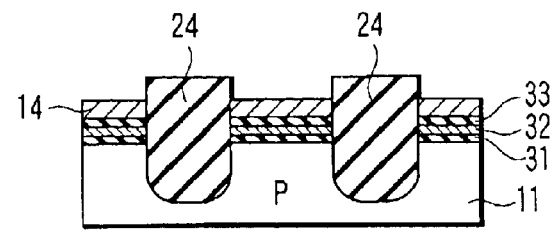
Figure 18E:
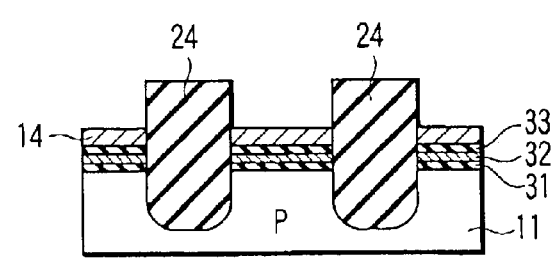

The device isolation grooves 24A are filled with insulation films 24 such as silicon oxide films. The insulation films 24 are flattened by CMP, as shown in FIG. 18D. Further, as shown in FIG. 18E, the stopper insulation film 22 is removed by wet etching. FIGS. 19A to 19C are cross-sectional views in which the device isolation regions have been formed by the above process.

FIG. 19A, FIG. 20A, FIG. 21A, FIG. 22A, FIGS. 23 to 25, FIG. 26A and FIG. 26B are cross-sectional views taken along line A—A perpendicular to the word lines. FIGS. 19A to 22A show cross-sectional structures of the source line and the select transistor regions arranged on both sides of the source line. FIGS. 23 to 25 and FIGS. 26A and 26B are cross-sectional views of a NAND memory cell block including the source line and bit line contact. FIG. 19B, FIG. 20B, FIG. 21B and FIG. 22B are cross-sectional views taken along line B—B that extends along the source region. FIG. 19C, FIG. 20C, FIG. 21C, and 22C are cross-sectional views taken along line D—D that extends along the memory cell. In the case where the memory cell transistors and select transistors have the MONOS structure, as in the second embodiment, the cross section along line C—C extending along the select transistor region is the same as the cross section along line D—D extending along the memory cell region. Thus, the cross section along line C—C is omitted here.

Figure 20A:
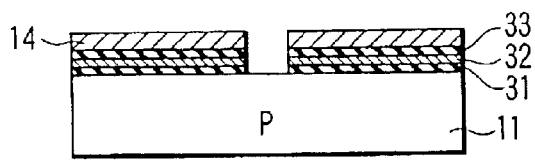
FIGS. 20A to 20C are cross-sectional views illustrating a third step in the method of fabricating the semiconductor device of the second embodiment.
Figure 20B:
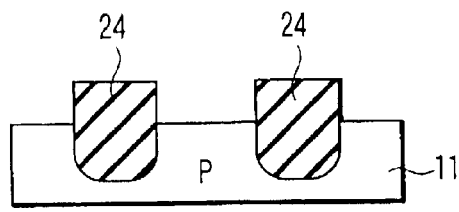
Figure 20C:
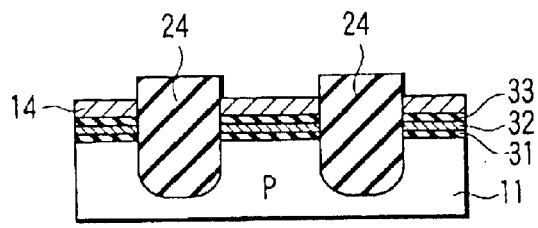

Following the above-described step, a resist film is patterned by photolithography. Using the patterned resist film as a mask, as shown in FIGS. 20A to 20C, anisotropic etching is performed to remove the polysilicon film 14 and the gate insulation film comprising the tunnel insulation film 31, charge accumulation layer 32 and block insulation film 33 in the source line region. In this step, there is a case where upper portions of the device isolation insulation films in the source line region may also be etched away. Further, if impurities such as phosphorus or arsenic are implanted in the semiconductor substrate, an n-type diffusion layer may be formed at an interface between the source line and the semiconductor substrate, as shown in FIG. 17C.

An impurity-heavily-doped polysilicon film 14 with a thickness of about 10 nm to 300 nm is deposited on the polysilicon film 14, semiconductor substrate 11 and device isolation insulation films 24, which are shown in FIGS. 20A to 20C. Then, as shown in FIGS. 21A to 21C, the deposited polysilicon film 14 is flattened by CMP.

Figure 21A:
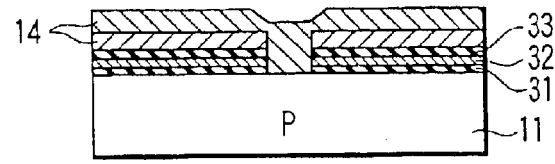
FIGS. 21A to 21C are cross-sectional views illustrating a fourth step in the method of fabricating the semiconductor device of the second embodiment.
Figure 21B:
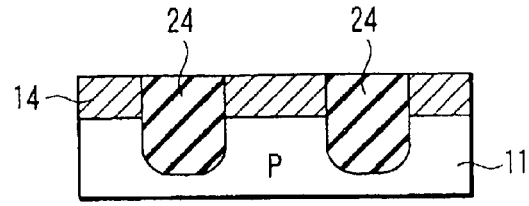
Figure 21C:
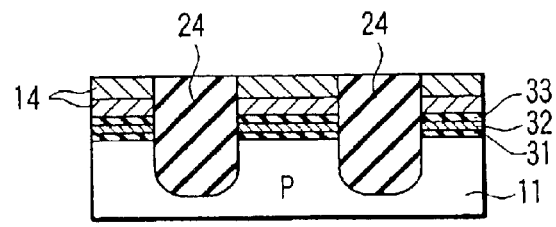
Figure 22A:
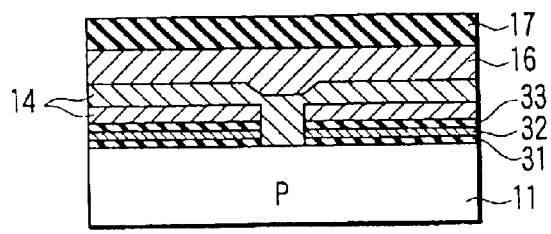
FIGS. 22A to 22C are cross-sectional views illustrating a fifth step in the method of fabricating the semiconductor device of the second embodiment.
Figure 22C:
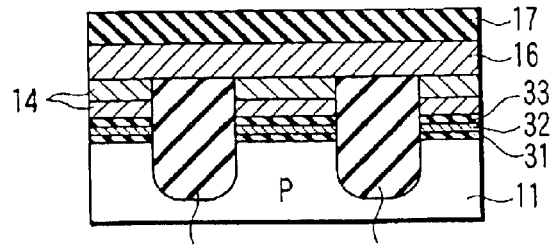
Figure 22B:
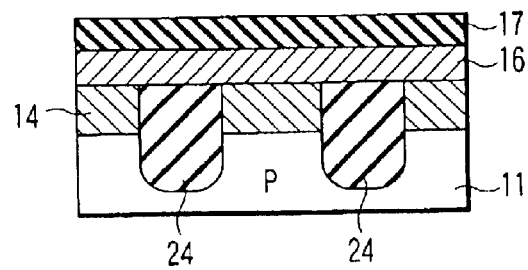

Thereafter, as shown in FIGS. 22A to 22C, a conductive film 16 with a thickness of about 10 nm to 300 nm is formed on the polysilicon 14 and device isolation insulation films 24 shown in FIGS. 21A to 21C. The conductive film 16 has, for example, one of the following structures: a stacked structure of tungsten silicide (WSi) and polysilicon; a stacked structure of a metal compound of silicon, such as NiSi, MoSi, TiSi or CoSi, and polysilicon; a stacked structure of a metal, such as W, Cu or Al, and polysilicon; and a single-layer structure of a metal compound of silicon, or a metal. A cap insulation film 17 is formed on the conductive film 16.

Figure 23:
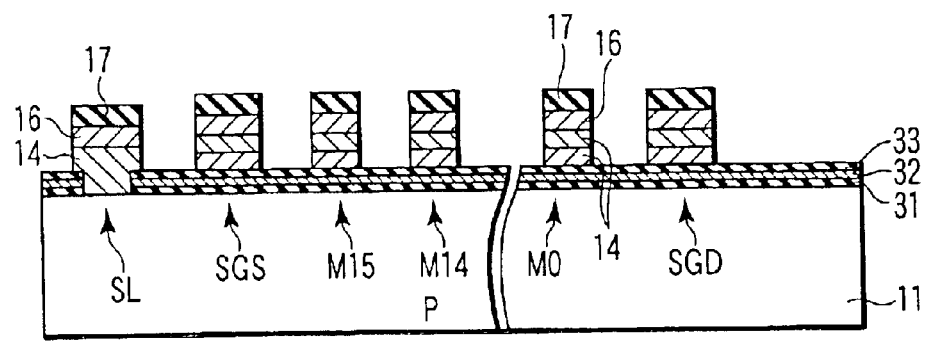
FIG. 23 is a cross-sectional view illustrating a sixth step in the method of fabricating the semiconductor device of the second embodiment.

Following the above step, using a photolithographically patterned resist film and cap insulation film 17 as a mask, anisotropic etching is carried out to process the gate electrodes of the memory cell transistors M0 to M15 and select transistors SGD and SGS and the source line SL, as shown in FIG. 23.

Figure 24:
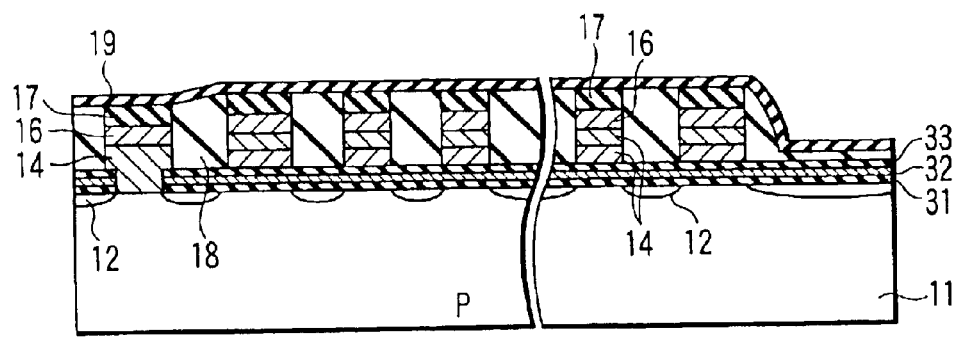
FIG. 24 is a cross-sectional view illustrating a seventh step in the method of fabricating the semiconductor device of the second embodiment.

Then, as shown in FIG. 24, impurities such as phosphorus or arsenic are then implanted in the semiconductor substrate 11 between the gate electrodes of the memory cell transistors and select transistors and between the gate electrode and source line SL, thereby forming n-type diffusion layers 12 that are source/drain regions. In addition, interlayer insulation films 18 such as silicon oxide films are filled in between the gate electrodes and between the gate electrode and source line SL.

Next, a barrier insulation film 19, which is, e.g. about 5 nm to 50 nm thick, is formed on the gate electrodes of the memory cell transistors and select transistors, the source line SL and the interlayer insulation films 18.

Figure 25:
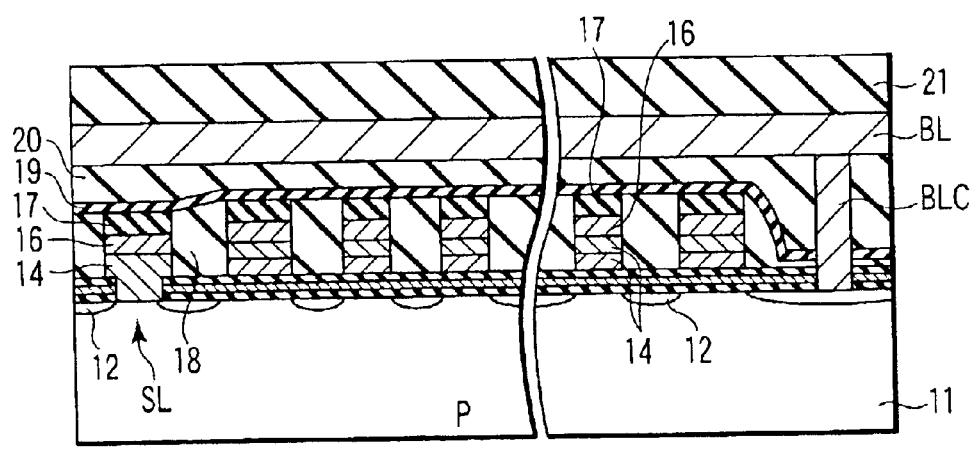
FIG. 25 is a cross-sectional view illustrating an eighth step in the method of fabricating the semiconductor device of the second embodiment.

Then, as shown in FIG. 25, an interlayer insulation film 20 such as a silicon oxide film is deposited, and the interlayer insulation film 20 is flattened by CMP. Further, a bit line contact BLC connected to the n-type diffusion layer 12 is formed in the interlayer insulation film 20. A bit line BL is formed on the bit line contact BLC and interlayer insulation film 20. An insulation film 21 is formed over the bit line BL and interlayer insulation film 20.

Subsequently, although not illustrated, upper wiring, a passivation film, etc. are formed to complete fabrication of the NAND-type EEPROM.

In the second embodiment, too, the conductive material of the source line is formed of the same material, and in the same layer, as the control gate electrode of each memory cell and each select transistor. Therefore, the same advantage as with the first embodiment can be obtained. Furthermore, in the second embodiment, the gate electrode of each memory cell has the single-layer structure without an inter-poly-insulation film. This eliminates the necessity to etch the inter-poly-insulation film in the select transistor region and source line region, and the fabrication steps can be simplified.

Figure 26A:
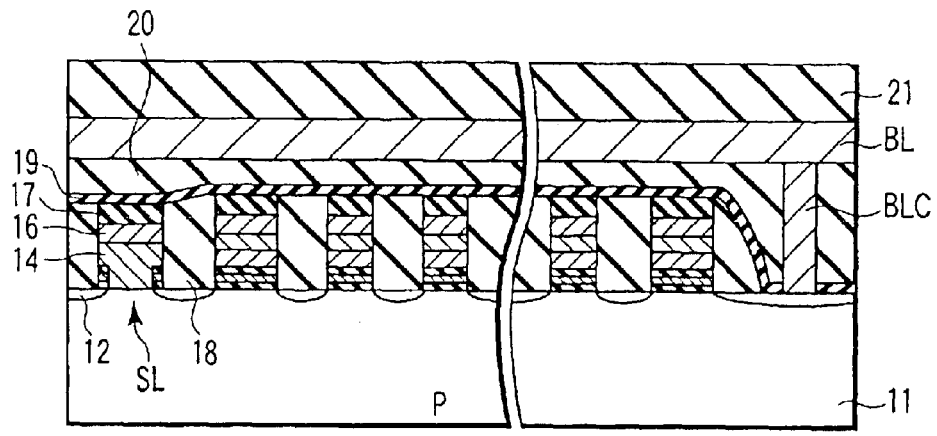
FIGS. 26A and 26B are cross-sectional views showing the structures of semiconductor devices according to modifications of the second embodiment.
Figure 26B:
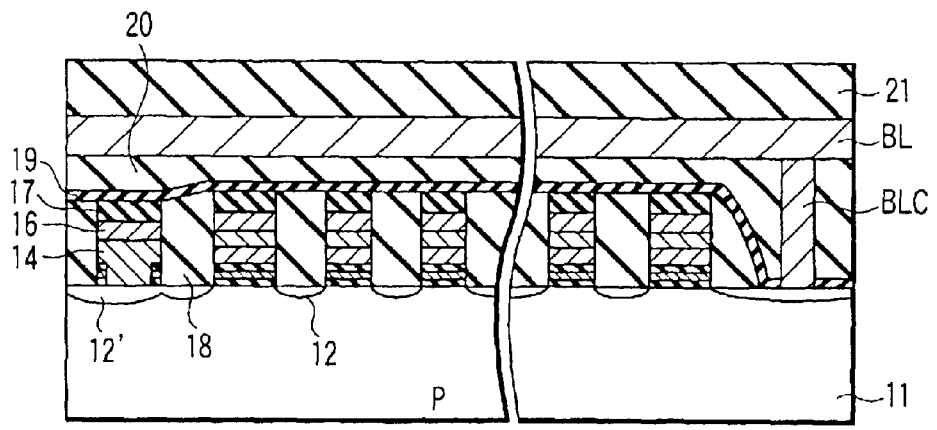

In the second embodiment, as shown in FIG. 25, the gate insulation film comprising the tunnel insulation film 31, charge accumulation layer 32 and block insulation film 33 is left between the gate electrodes. However, as shown in FIGS. 26A and 26B, the gate insulation film between the gate electrodes may be removed. Alternatively, only the block insulation film 33, or portions of the block insulation film 33 and charge accumulation layer 32, may be removed.

The operation of the NAND-type EEPROM according to the second embodiment will now be described.

In an erase operation, for example, a high voltage (e.g. 5 V to 25 V) is applied to the semiconductor substrate 11 in the state in which the control gate electrode 16 is set at 0 V. Thereby, holes are injected from the semiconductor substrate 11 into the charge accumulation layer 32. In another method, hot holes are produced by positively biasing the diffusion layer potential relative to the semiconductor substrate 11. In addition, by negatively biasing the control gate electrode 16 relative to the semiconductor substrate 11, the hot holes are injected in the charge accumulation layer 32. Thus, the erase operation is effected.

In a write operation, for example, a high voltage (e.g. 5 V to 20 V) is applied to the control gate electrode 16 in the state in which the semiconductor substrate 11 is set at 0 V. Thereby, electrons are injected from the semiconductor substrate 11 into the charge accumulation layer 32, and the write operation is effected. In another method, hot electrons, which are accelerated in the channel, are produced by positively biasing the drain potential relative to the source potential. In addition, by positively biasing the control gate electrode 16 relative to the source potential, the hot electrons are injected in the charge accumulation layer 32. Thus, the write operation is effected.

In a read-out operation, the bit line BL is precharged and then set in a floating state. The voltage of the control gate electrode 16 of the memory cell selected for read-out is set at Vref, and the voltage of the control gate electrodes of the other memory cell transistors is set at a non-selected readout voltage Vread. Further, the voltage of the control gate electrode 16 of the select transistor SGS, SGD is set at a power supply voltage Vcc, and the source line SL is set at 0 V. Whether current flows in the memory cell selected for read-out is detected by the bit line BL. Thus, the read-out operation is effected. Specifically, if the selected memory cell is at a threshold voltage Vth>Vref (write state), the memory cell is in the off state and the bit line BL maintains a precharge potential.

On the other hand, if the selected memory cell is at a threshold voltage Vth<Vref (read state), the memory cell is turned on, and the potential of the bit line BL lowers from the precharge potential by ΔV. This potential change is sensed by a sense amplifier, and the data in the memory cell is read out.

As has been described above, in the second embodiment, it is possible to prevent an increase in height of the source line SL and to thus prevent an increase in the aspect ratio of the bit line contact. Moreover, it is possible to suppress a decrease in lithography margin in the step of patterning the gate electrode. Besides, since the source line is formed at the same time as the select transistors and memory cell transistors, the number of fabrication steps can be reduced. Furthermore, the gate electrode of each memory cell has the single-layer structure without an inter-poly-insulation film. This eliminates the necessity to etch the inter-poly-insulation film in the select transistor region and source line region, and the fabrication steps can be simplified.

[Third Embodiment]

A semiconductor device according to a third embodiment of the present invention will now be described.

The third embodiment differs from the first and second embodiments in that the source line is processed after the gate electrodes of the memory cell transistors and select transistors are processed. Structural parts common to those of the first embodiment are denoted by like reference numerals, and a description thereof is omitted. Only different parts will be described.

Figure 27:
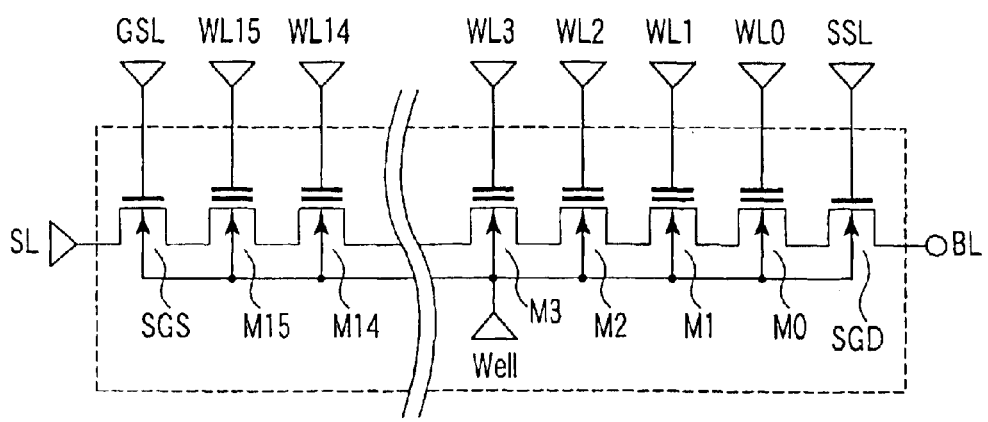
FIG. 27 is a circuit diagram showing the structure of a semiconductor device according to a third embodiment of the present invention.
Figure 28A:
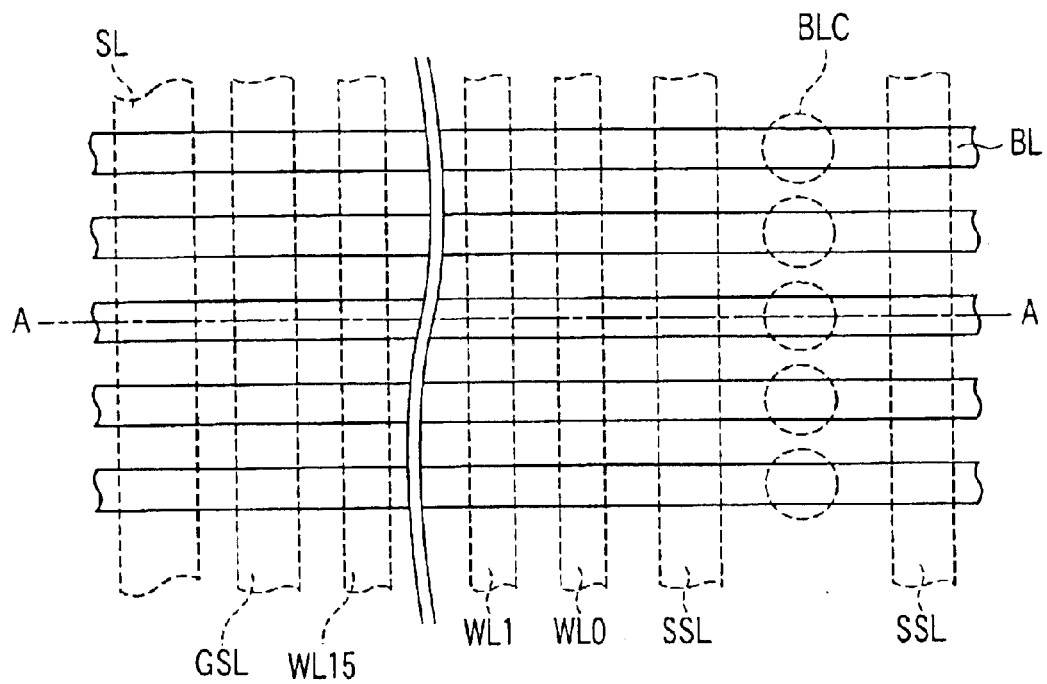
FIG. 28A is a layout of the semiconductor device of the third embodiment.
Figure 28B:
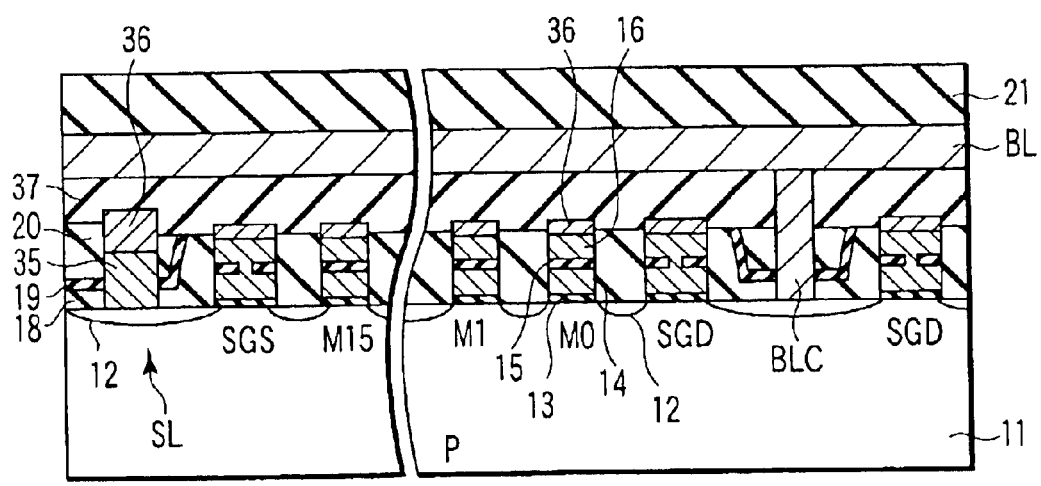
FIG. 28B is a cross-sectional view of the semiconductor device of the third embodiment, taken along line A—A in the layout of FIG. 28A.

FIG. 27 is a circuit diagram showing the structure of a NAND-type EEPROM according to the third embodiment of the invention. FIG. 28A is a layout of the NAND-type EEPROM according to the third embodiment. FIG. 28B is a cross-sectional view taken along line A—A in the layout of FIG. 28A. The circuit diagram of FIG. 27 and the layout of FIG. 28A are the same as those of the first embodiment.

As is shown in FIG. 28B, n-type diffusion layers 12, which are source/drain regions, are arranged such that they are spaced apart in a p-type semiconductor substrate or a p-type well region (hereinafter referred to as "semiconductor substrate") 11. A floating gate electrode 14 is formed on that portion of the semiconductor substrate 11, which lies between the n-type diffusion layers 12, with a tunnel insulation film 13 interposed. A control gate electrode 16 is formed over the floating gate electrode 14, with an inter-poly-insulation film 15 interposed. In addition, a silicide layer 36 is formed on the control gate electrode 16. Thereby, both ends of the current paths of memory cell transistors M0, M1, . . . , M15 are connected to constitute a NAND cell. The control gate electrode 16 is an impurity-heavily-doped poly-silicon film about 10 nm to 300 nm thick. The silicide layer 36 is formed of a metal compound of silicon, such as NiSi, MoSi, TiSi or CoSi, with a thickness of about 10 nm to 300 nm.

The control gate electrodes 16 and silicide layers 36 of the memory cell transistors M0 to M15 correspond to word lines WL0 to WL15.

A select transistor SGD, comprising the aforementioned tunnel insulation film 13, floating gate electrode 14, inter-poly-insulation film 15, control gate electrode 16 and silicide layer 36, is formed at one end of the NAND cell. A select transistor SGD of another block is formed at one end of this select transistor SGD, with an n-type diffusion layer 12 and a bit line contact BLC interposed therebetween.

At the other end of the NAND cell, a select transistor SGS is formed, which comprises the aforementioned tunnel insulation film 13, floating gate electrode 14, inter-poly-insulation film 15, control gate electrode 16 and silicide layer 36.

A portion of the inter-poly-insulation film 15 in the select transistor SGD, SGS is removed so as to establish electrical conduction between the floating gate electrode 14 and control gate electrode 16. Thus, the floating gate electrode 14, control gate electrode 16 and silicide layer 36 of the select transistor SGD correspond to the select line SSL, and the floating gate electrode 14, control gate electrode 16 and silicide layer 36 of the select transistor SGS correspond to the select line GSL. Further, a source line SL is formed at one end of the select transistor SGS.

The source line SL has a cross-sectional structure as described below. In the semiconductor substrate 11, an n-type diffusion layer 12 is formed. Interlayer insulation films 18 and 20 and a barrier insulation layer 19 are formed on the n-type diffusion layer 12. A groove reaching the n-type diffusion layer 12 is formed in the interlayer insulation films 18 and 20 and barrier insulation layer 19 provided over the n-type diffusion layer 12. A polysilicon film 35 is buried in the groove. A silicide layer 36 is formed on the polysilicon film 35.

The polysilicon film 35 and silicide layer 36 constitute a source line SL. The source line SL and n-type diffusion layer 12 are electrically connected. The height of the source line SL from the surface of the semiconductor substrate 11 is substantially equal to the height of the gate electrode of each of the memory cell transistors and select transistors from the surface of the semiconductor substrate 11. The silicide layer 36 of the source line SL is formed in the same layer as the silicide layer 36 of each select transistor SGS, SGD and the silicide layer 36 of each memory cell, M0 to M15.

Further, as is shown in FIG. 28B, an interlayer insulation film 37, a bit line contact BLC, a bit line BL and an insulation film 21 are formed.

A fabrication method of the semiconductor device according to the third embodiment will now be described.

FIGS. 29A to 29C, FIGS. 30A to 30C, FIG. 31A and FIG. 31B are cross-sectional views illustrating the steps of the fabrication method of the semiconductor device according to the third embodiment. These Figures are cross-sectional views taken along line A—A in the layout of FIG. 28A.

To start with, gate electrodes of the memory cell transistors M0 to M15 and select transistors SGD and SGS are processed. The memory cell has a stacked structure wherein a tunnel insulation film 13, a polysilicon film 14, an inter-poly-insulation film 15 and a polysilicon 16 are stacked in the named order on the semiconductor substrate 11. The select transistor also has a stacked structure wherein a tunnel insulation film 13, a polysilicon film 14, an inter-poly-insulation film 15 and a polysilicon 16 are stacked in the named order on the semiconductor substrate 11. In the select transistor, a part of the inter-poly-insulation film 15 is removed to establish electrical conduction between the polysilicon 14 and polysilicon 16. The polysilicon films 14 and 16 are doped with impurities. The polysilicon film 14 has a thickness of about 10 nm to 200 nm, and the polysilicon film 16 has a thickness of about 10 nm to 300 nm.

Figure 29A:
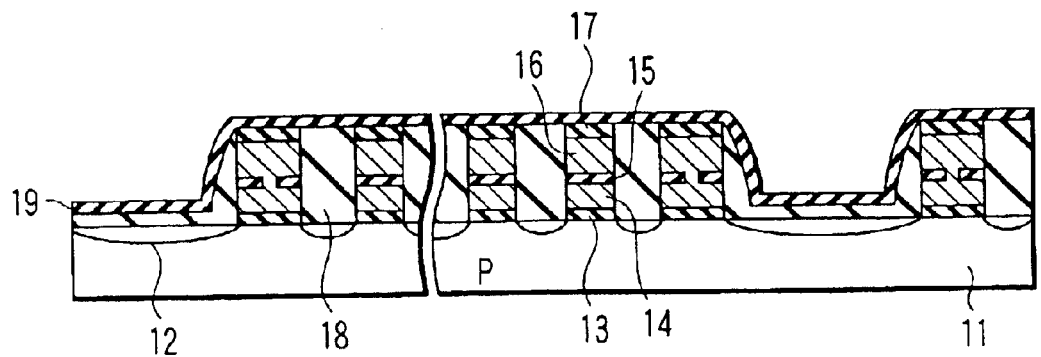
FIGS. 29A to 29C are cross-sectional views illustrating a first step in a method of fabricating the semiconductor device of the third embodiment.

Then, as is shown in FIG. 29A, impurities such as phosphorus or arsenic are implanted in the semiconductor substrate 11 between the gate electrodes of the memory cell transistors and select transistors, thereby forming n-type diffusion layers 12 that are source/drain regions. In addition, interlayer insulation films 18 such as silicon oxide films are filled in between the gate electrodes of the memory cell transistors and select transistors.

Next, a barrier insulation film 19 such as a silicon nitride film, which is, e.g. about 5 nm to 50 nm thick, is formed on the gate electrodes of the memory cell transistors and select transistors. Cap insulation films 17 such as silicon oxide films or silicon nitride films, which are about 10 nm to 100 nm thick, are formed between the gate electrodes of the memory cell transistors and select transistors and the barrier insulation film 19.

Figure 29B:
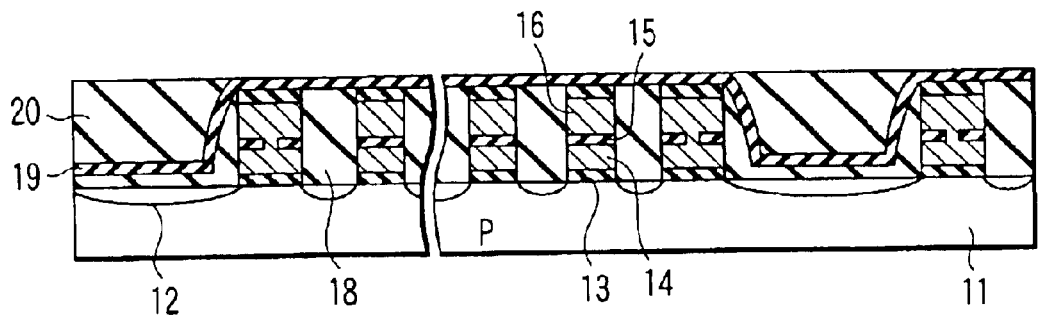
Figure 29C:
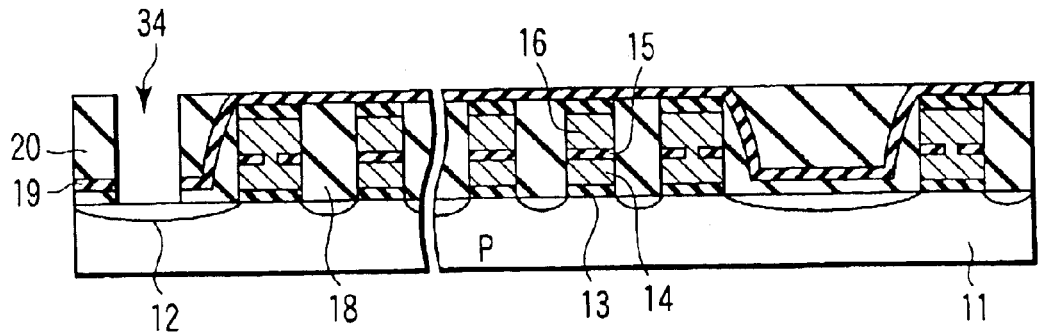

An interlayer insulation film 20 such as a silicon oxide film is then deposited, as shown in FIG. 29B, and the interlayer insulation film 20 is flattened by CMP. Further, as shown in FIG. 29C, the interlayer insulation film 20 and barrier insulation film 19 in the source region are etched away, thus forming a groove 34 for burying the source line. In FIG. 29C, the source line groove 34 is formed perpendicular to the semiconductor substrate 11. Alternatively, the source line groove 34 may be formed in a tapered shape, which can advantageously achieve improved burying of conductive material.

Figure 30A:
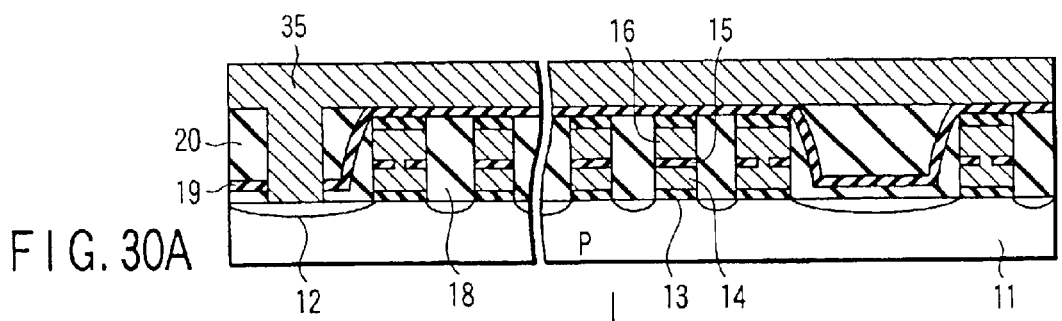
FIGS. 30A to 30C are cross-sectional views illustrating a second step in the method of fabricating the semiconductor device of the third embodiment.
Figure 30B:
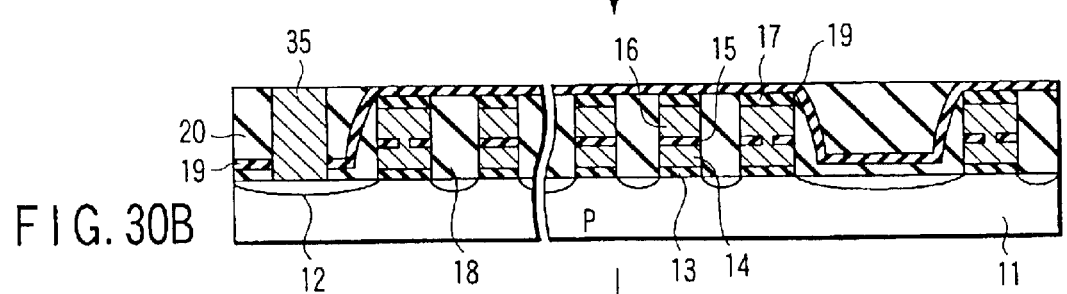

As is shown in FIG. 30A, an impurity-doped polysilicon film 35 is deposited on the structure illustrated in FIG. 29C. The polysilicon film 35 is then etched back by means of CMP, etc., as shown in FIG. 30B. Thereby, the polysilicon film 35 constituting the source line, which is buried in the groove 34 in the interlayer insulation film 20, is formed. In this case, the height of the polysilicon film 35 that constitutes the source line is determined by the height of the gate electrode of each memory cell and each select transistor.

Figure 30C:
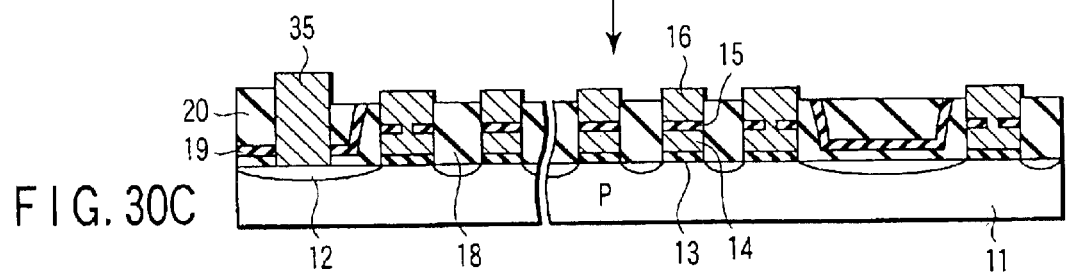

Subsequently, the barrier insulation film 19 and cap insulation films 17 covering the gate electrodes of the memory cell transistors and select transistors are removed by wet etching or anisotropic etching. Thereby, as shown in FIG. 30C, the polysilicon films 35 forming the gate electrodes 16 and source line are exposed. In this case, the height of the source line 35 from the semiconductor substrate is substantially equal to the height of each select transistor and each memory cell. However, in order to decrease the resistivity of the source line, it is preferable that the height of the source line 35 be higher than each select transistor or memory cell by about 10 nm to 100 nm. This is realized by the technique wherein the source line 35 is formed higher than the gate electrodes of the select transistors and memory cell transistors by a degree corresponding to the thickness of the cap insulation film 17 and barrier insulation film 19, as shown in FIG. 30B.

Then, a metal film of nickel (Ni), molybdenum (Mo), titanium (Ti) or cobalt (Co) is deposited on the structure shown in FIG. 30C, and the resultant structure is annealed. Thereby, as shown in FIG. 31A, upper portions of the polysilicon films 16 and 36 constituting the gate electrodes and source line are silicided into silicon-metal compounds 36 such as NiSi, MoSi, TiSi or CoSi.

Figure 31A:
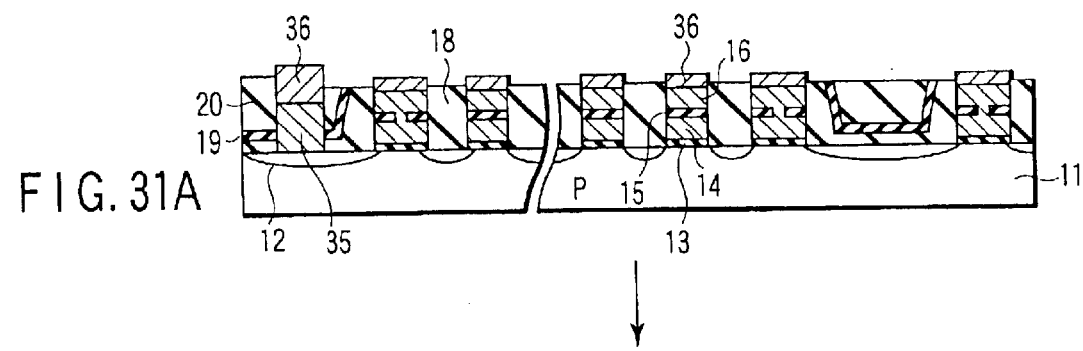
FIGS. 31A and 31B are cross-sectional views illustrating a third step in the method of fabricating the semiconductor device of the third embodiment.
Figure 31B:
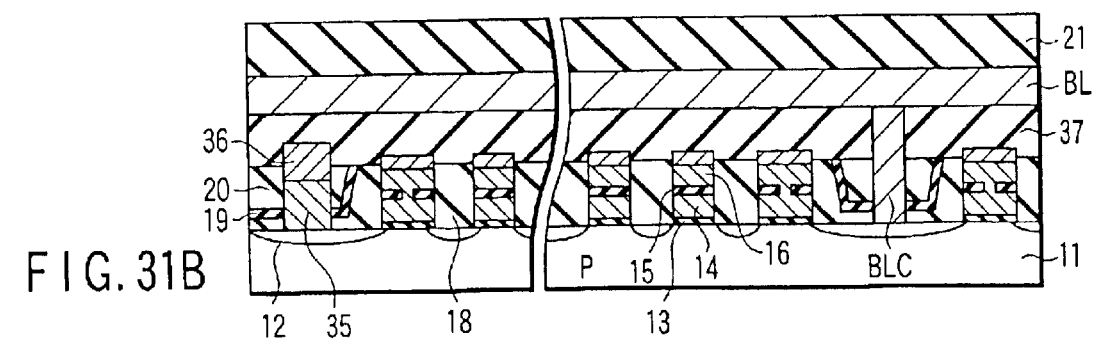

On the structure shown in FIG. 31A, an interlayer insulation film 37 such as a silicon oxide film is deposited. The interlayer insulation film 37 is flattened by CMP. Further, a bit line contact BLC connected to the n-type diffusion layer 12 is formed in the interlayer insulation films 18, 20 and 37. A bit line BL is formed on the bit line contact BLC and interlayer insulation film 37. An insulation film 21 is formed on the bit line BL and interlayer insulation film 37.

Subsequently, although not illustrated, upper wiring, a passivation film, etc. are formed to complete fabrication of the NAND-type EEPROM.

As regards the semiconductor device with the above-described structure and the fabrication method thereof, compared to the first and second embodiments, the number of fabrication steps can be reduced since there is no need to remove the tunnel insulation film (gate insulation film) 13 between the polysilicon film 35 constituting the source line SL and the semiconductor substrate 11. In addition, since it is not necessary to provide a margin for alignment between the pattern after removal of the tunnel insulation film 13 and the polysilicon film 35 of the source line SL, the area of the NAND-type EEPROM can be reduced.

Figure 2A:
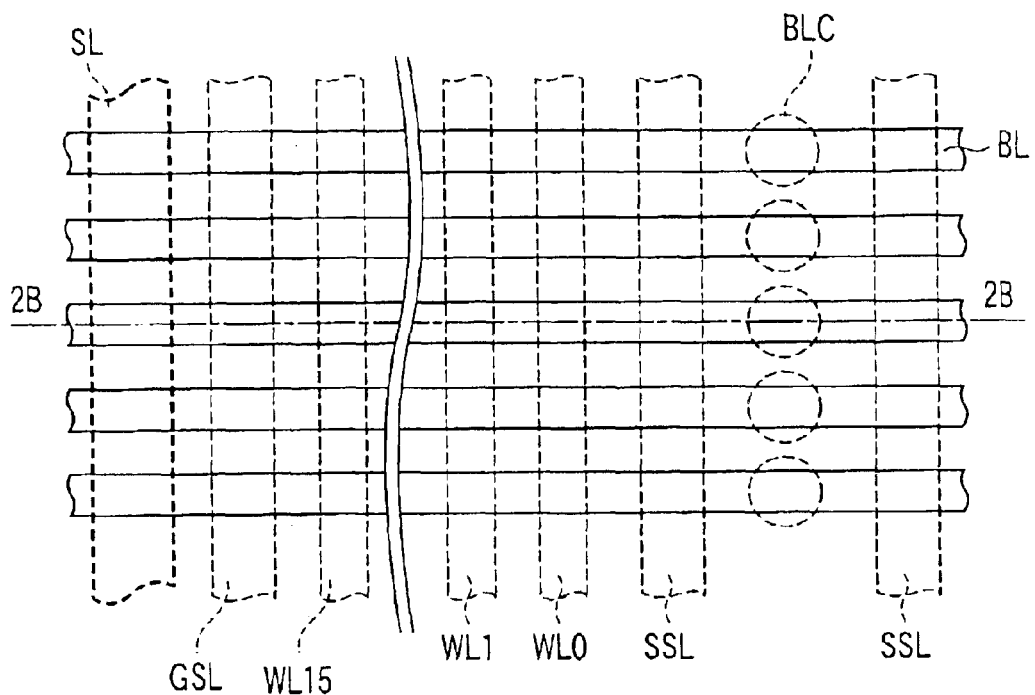
FIG. 2A is a layout of the semiconductor device.
Figure 2B:
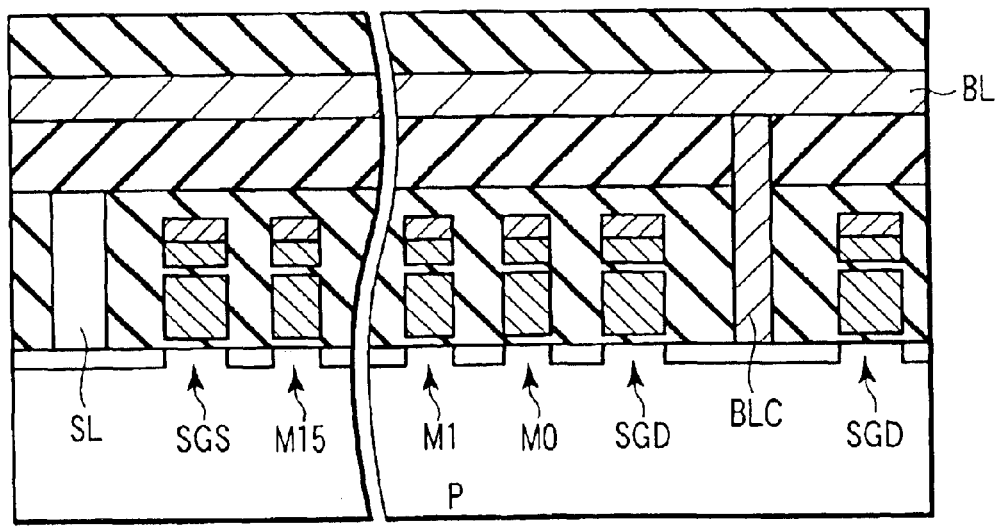
FIG. 2B is a cross-sectional view of the semiconductor device, taken along line 2B—2B in the layout of FIG. 2A.

This embodiment differs from the prior art shown in FIG. 2B in that the buried conductive material of the source line SL has a stacked structure. The upper conductive material of the stacked structure of the source line is a silicon-metal compound (silicide) such as NiSi, MoSi, TiSi or CoSi. Thus, compared to the prior-art source line formed of single-layer polysilicon, the resistivity of the source line is low and the height of the source line can be reduced. Preferably, the height of the source line should be made equal to the height of the gate electrode of each select transistor and each memory cell. If the fabrication method of this embodiment is used, the height of the source line is determined by the gates of the select transistors and memory cell transistors and therefore the height of the source line can stably be set. Since a variance in source line resistivity is decreased, a variance in characteristics of the nonvolatile memory, in particular, in the data read-out mode, can be reduced.

Furthermore, the silicide, which is the upper conductive material of the stacked structure of the source line SL, is the same as the upper conductive material of the gate electrode of each memory cell and each select transistor, and the silicidation is performed in the same fabrication step. Therefore, the fabrication process can be simplified. In addition, since the resistivity of the source line SL is equal to that of each select line SSL, GSL and each word line, WL0 to WL15, the circuitry design becomes easier.

In the third embodiment, like the first embodiment, the memory cell is of the floating gate type. Alternatively, it may be of the MONOS type, like the second embodiment.

The barrier insulation film 19, which is formed of, e.g. a silicon nitride film about 5 nm to 50 nm thick, is provided between the select transistors. The barrier insulation film 19 serves as an etching stopper film that prevents the bit line contact BLC from sinking in the device isolation groove.

In the semiconductor device of the third embodiment, the source line SL is formed of the silicide layer having a higher conductivity than polysilicon, as mentioned above. Thus, the source line resistivity can be made lower than in the conventional semiconductor device shown in FIG. 2B. Hence, the height of the source line can be decreased. Thereby, the bit line BL can also be formed lower than in the conventional semiconductor device, and the aspect ratio of the bit line contact BLC can be reduced. As a result, the processing of the semiconductor device can be facilitated, and the device yield is increased.

The write, erase and read-out operations of the NAND-type EEPROM of the third embodiment are the same as those in the first or second embodiment, so a description thereof is omitted here.

As has been described above, according to the third embodiment, the conductive material that forms the source line has the stacked structure, and the source line resistivity is decreased. Thereby, an increase in height of the source line SL is prevented, and also an increase in the aspect ratio of the bit line contact is prevented. Thus, the processing is facilitated. Besides, a part of the conductive material that forms the source line is provided in the same layer as the control gates of the select transistors and memory cell transistors (i.e. select lines and word lines). Hence, the fabrication steps can be simplified, the source line resistivity is made equal to the resistivity of the select lines and word lines, and the circuitry design is facilitated.

[Fourth Embodiment]

A semiconductor device according to a fourth embodiment of the present invention will now be described.

In the fourth embodiment, like the third embodiment, the source line SL is processed after the gate electrodes of the memory cell transistors and select transistors are processed. In addition, the source line comprises stacked conductive films, and the upper conductive film is formed of a conductive material having a lower resistivity than impurity-doped polysilicon. The fourth embodiment differs from the third embodiment in that the upper conductive film is formed in the same fabrication step using damascene processing, and in the same layer, as the conductive films constituting the control gate electrodes of the memory cell transistors and select transistors.

Figure 32:
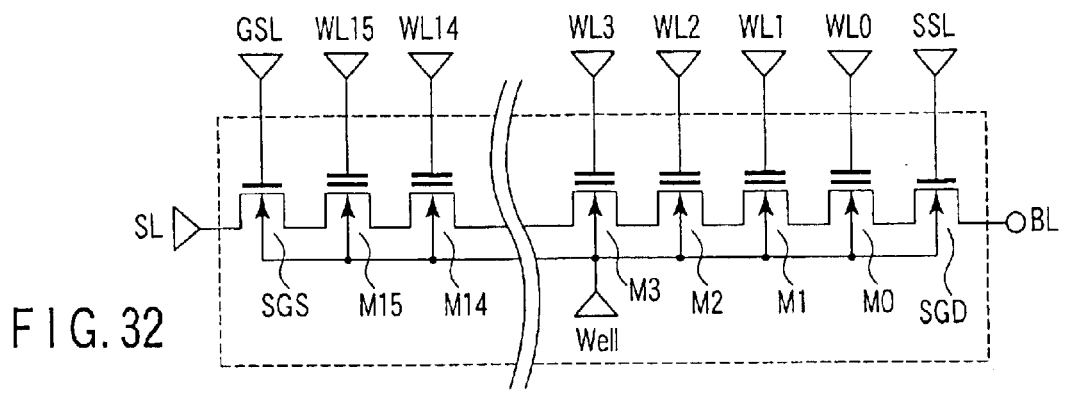
FIG. 32 is a circuit diagram showing the structure of a semiconductor device according to a fourth embodiment of the present invention.
Figure 33A:
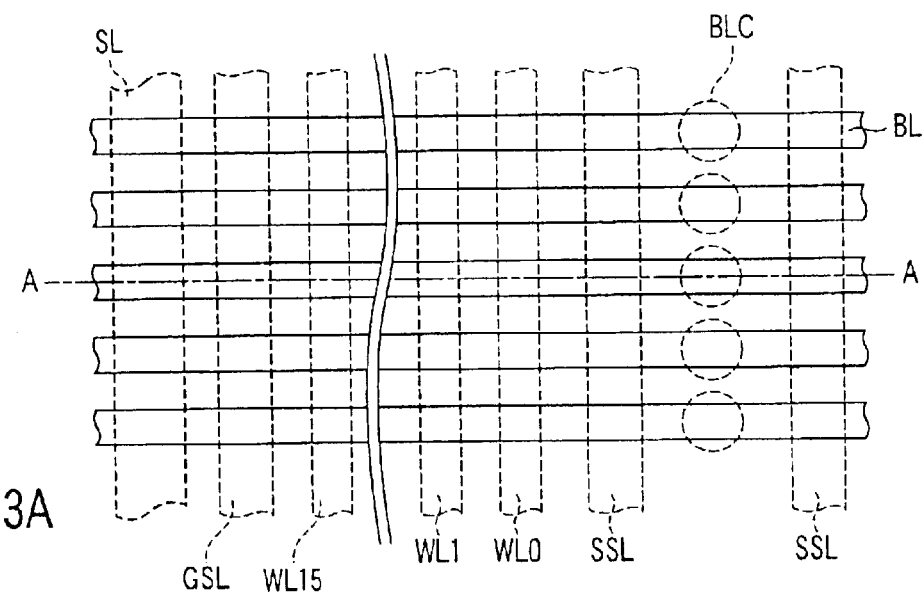
FIG. 33A is a layout of the semiconductor device of the fourth embodiment.
Figure 33B:
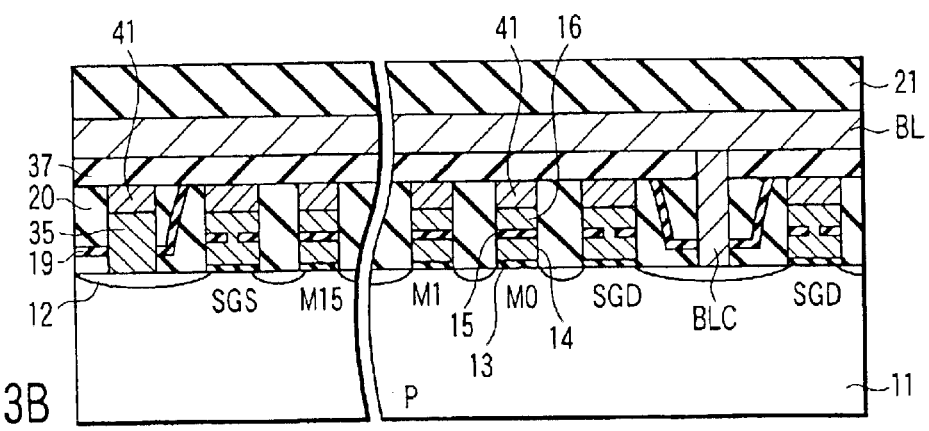
FIG. 33B is a cross-sectional view of the semiconductor device of the fourth embodiment, taken along line A—A in the layout of FIG. 33A.

FIG. 32 is a circuit diagram showing the structure of a NAND-type EEPROM according to the fourth embodiment of the invention. FIG. 33A is a layout of the NAND-type EEPROM according to the fourth embodiment. FIG. 33B is a cross-sectional view taken along line A—A in the layout of FIG. 33A.

An upper conductive film 41 of the source line SL is formed of a silicon-metal compound such as tungsten silicide (WSi) or a metal such as Cu, Al or W. The conductive film 41 is formed not by silicidation of polysilicon, as in the third embodiment, but by damascene processing in which a conductive film is buried after the cap insulation film 17 of the gate electrode is removed. The damascene processing, compared to the silicidation, can reduce the manufacturing cost and enhance controllability.

A fabrication method of the semiconductor device according to the fourth embodiment will now be described.

FIGS. 34A to 34C, FIGS. 35A to 35C, FIG. 36A and FIG. 36B are cross-sectional views illustrating the steps of the fabrication method of the semiconductor device according to the fourth embodiment. These Figures are cross-sectional views taken along line A—A in the layout of FIG. 33A.

To start with, gate electrodes of the memory cell transistors M0 to M15 and select transistors SGD and SGS are processed. The gate electrode of the memory cell has a stacked structure wherein a tunnel insulation film 13, a polysilicon film 14, an inter-poly-insulation film 15 and a polysilicon 16 are stacked in the named order on the semiconductor substrate 11. The select transistor also has a stacked structure wherein a tunnel insulation film 13, a polysilicon film 14, an inter-poly-insulation film 15 and a polysilicon 16 are stacked in the named order on the semiconductor substrate 11. In the select transistor, a part of the inter-poly-insulation film 15 is removed to establish electrical conduction between the polysilicon 14 and polysilicon 16. The polysilicon films 14 and 16 are doped with impurities. The polysilicon film 14 has a thickness of about 10 nm to 200 nm, and the polysilicon film 16 has a thickness of about 10 nm to 300 nm.

Figure 34A:
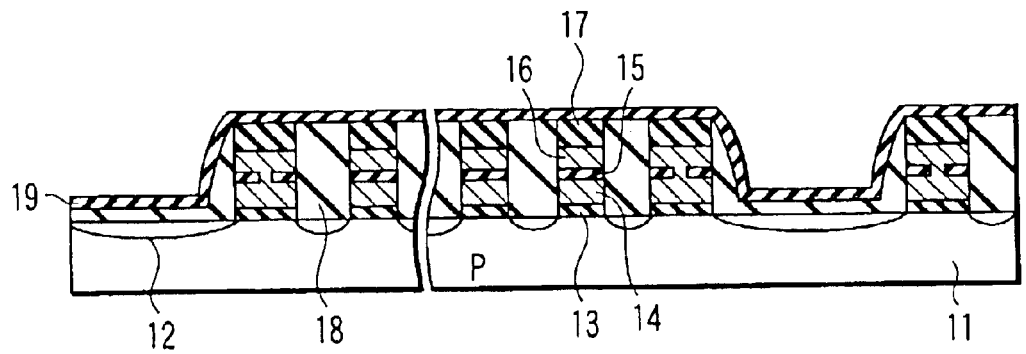
FIGS. 34A to 34C are cross-sectional views illustrating a first step in a method of fabricating the semiconductor device of the fourth embodiment.

Then, as is shown in FIG. 34A, impurities such as phosphorus or arsenic are implanted in the semiconductor substrate 11 between the gate electrodes of the memory cell transistors and select transistors, thereby forming n-type diffusion layers 12 that are source/drain regions. In addition, interlayer insulation films 18 such as silicon oxide films are filled in between the gate electrodes of the memory cell transistors and select transistors.

Next, a barrier insulation film 19 such as a silicon nitride film, which is, e.g. about 5 nm to 50 nm thick, is formed on the gate electrodes of the memory cell transistors and select transistors. Cap insulation films 17 such as silicon oxide films or silicon nitride films, which are about 10 nm to 100 nm thick, are formed between the gate electrodes of the memory cell transistors and select transistors and the barrier insulation film 19.

Figure 34B:
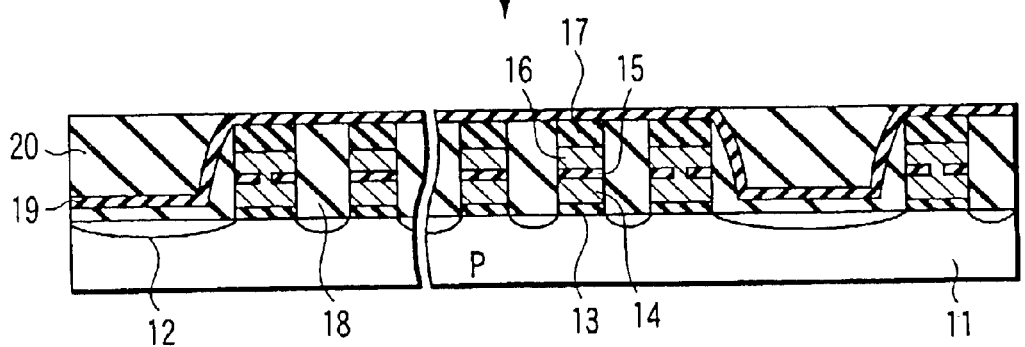
Figure 34C:
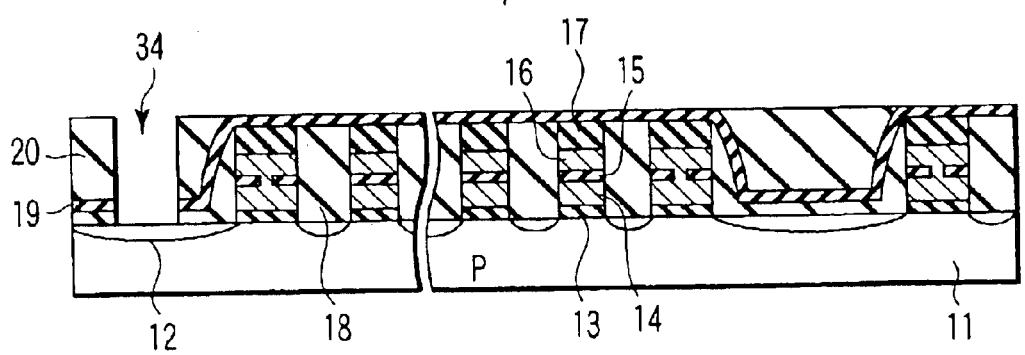

An interlayer insulation film 20 such as a silicon oxide film is then deposited, as shown in FIG. 34B, and the interlayer insulation film 20 is flattened by CMP. Further, as shown in FIG. 34C, the interlayer insulation film 20 and barrier insulation film 19 in the source region are etched away, thus forming a groove 34 for burying the source line. In FIG. 34C, the source line groove 34 is formed perpendicular to the semiconductor substrate 11. Alternatively, the source line groove 34 may be formed in a tapered shape, which can advantageously achieve improved burying of conductive material.

Figure 35A:
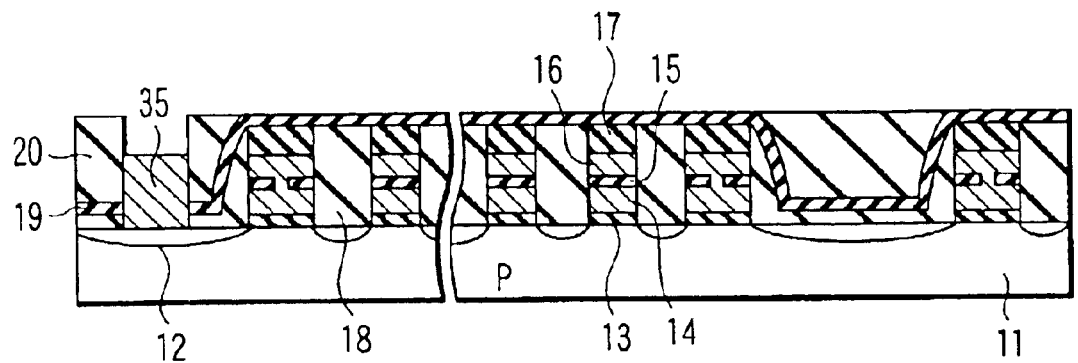
FIGS. 35A to 35C are cross-sectional views illustrating a second step in the method of fabricating the semiconductor device of the fourth embodiment.

An impurity-doped polysilicon film is deposited on the structure illustrated in FIG. 34C. The polysilicon film is then etched back by means of CMP, etc., as shown in FIG. 35A. Thereby, the polysilicon film 35 constituting the source line, which is buried in the groove 34 in the interlayer insulation film 20, is formed. In this case, it is desirable that the amount of etch-back of the polysilicon film 35 be 30 nm or more. As the amount of etch-back increases, a greater amount of conductive film with low resistivity can be buried in a later fabrication step, and the source line resistivity can be reduced. On the other hand, in order to reduce a variance in resistivity, it is desirable that the amount of etch-back be small. Taking both factors into account, an optimal amount of etch-back is determined.

Figure 35B:
Figure 35B:
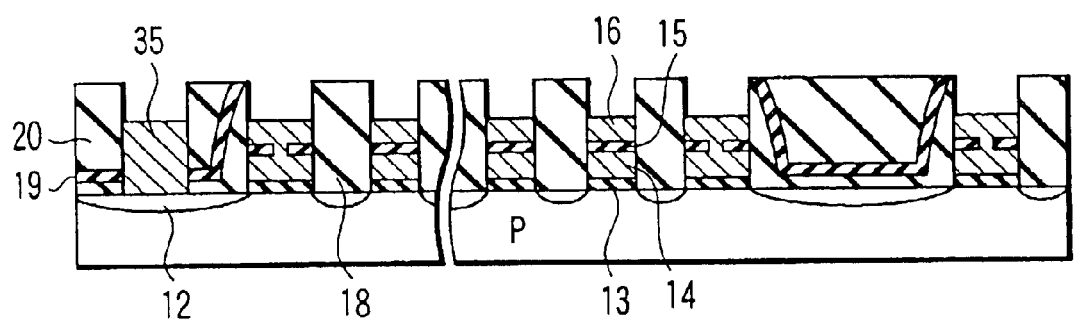

Subsequently, as shown in FIG. 35B, the barrier insulation film 19 and cap insulation films 17 covering the gate electrodes of the memory cell transistors and select transistors are removed by wet etching or anisotropic etching. Thereby, the polysilicon films 16 and 35 forming the gate electrodes and source line are exposed.

Figure 35C:
Figure 35C:
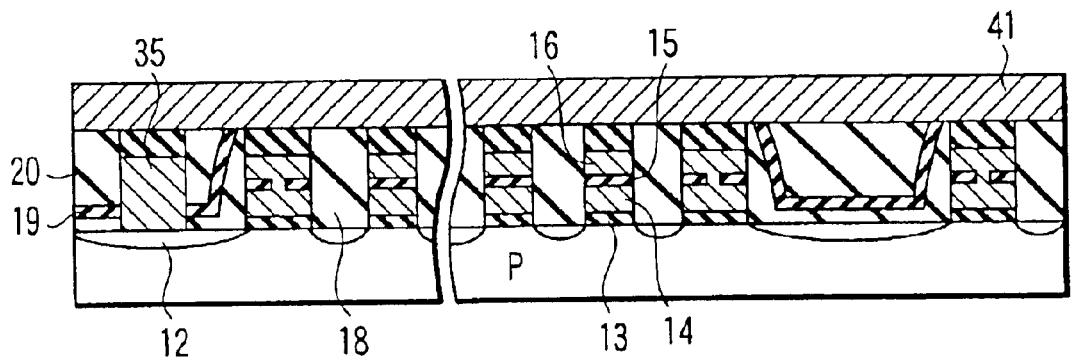

On the structure shown in FIG. 35B, a silicon-metal compound 41 such as tungsten silicide (WSi) or a metal 41 such as Cu, Al or W is deposited, as shown in FIG. 35C. Then, the deposited silicon-metal compound 41 or metal 41 is etched back by CMP, etc., as shown in FIG. 36A.

Figure 36A:
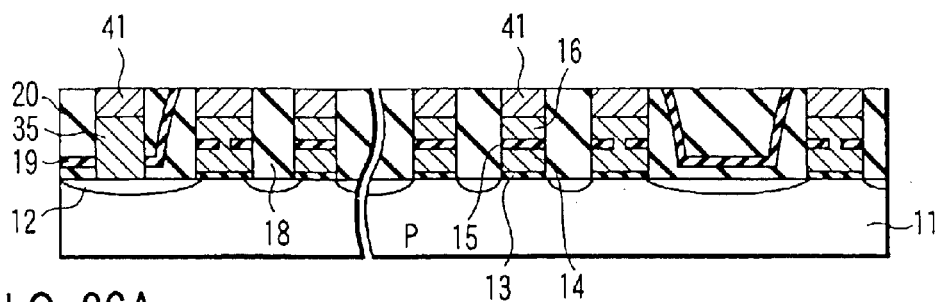
FIGS. 36A and 36B are cross-sectional views illustrating a third step in the method of fabricating the semiconductor device of the fourth embodiment.
Figure 36B:
Figure 36B:
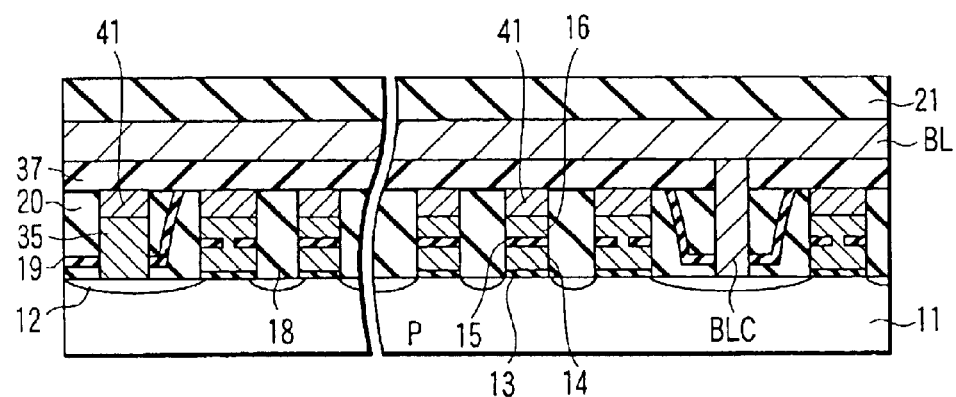

On the structure shown in FIG. 36A, an interlayer insulation film 37 such as a silicon oxide film is deposited. The interlayer insulation film 37 is flattened by CMP. Further, a bit line contact BLC connected to the n-type diffusion layer 12 is formed in the interlayer insulation films 18, 20 and 37. A bit line BL is formed on the bit line contact BLC and interlayer insulation film 37. An insulation film 21 is formed on the bit line BL and interlayer insulation film 37.

Subsequently, although not illustrated, upper wiring, a passivation film, etc. are formed to complete fabrication of the NAND-type EEPROM.

In the fourth embodiment, like the first embodiment, the memory cell is of the floating gate type. Alternatively, it may be of the MONOS type, like the second embodiment.

The barrier insulation film 19, which is formed of, e.g. a silicon nitride film about 5 nm to 50 nm thick, is provided between the select transistors. The barrier insulation film 19 serves as an etching stopper film that prevents the bit line contact BLC from sinking in the device isolation groove.

In the fourth embodiment, too, the source line SL comprises stacked conductive films, and the upper conductive film is formed of the conductive material having a higher conductivity than impurity-doped polysilicon. Therefore, the same advantage as with the third embodiment can be obtained. Furthermore, in the fourth embodiment, the upper conductive film of the source line is buried by damascene processing, as mentioned above. Thus, compared to the use of silicidation, the manufacturing cost can be reduced and the controllability enhanced. If the fabrication method of this embodiment is used, the height of the source line is determined by the gates of the select transistors and memory cell transistors and therefore the height of the source line can stably be set. Since a variance in source line resistivity is decreased, a variance in characteristics of the nonvolatile memory, in particular, in the data read-out mode, can be reduced.

The write, erase and read-out operations of the NAND-type EEPROM of the fourth embodiment are the same as those in the first or second embodiment, so a description thereof is omitted here.

As has been described above, according to the fourth embodiment, the conductive material that forms the source line has the stacked structure, and the source line resistivity is decreased. Thereby, an increase in height of the source line SL is prevented, and also an increase in the aspect ratio of the bit line contact is prevented. Thus, the processing is facilitated. Besides, a part of the conductive material that forms the source line is provided in the same layer as the control gates of the select transistors and memory cell transistors (i.e. select lines and word lines). Hence, the fabrication steps can be simplified, the source line resistivity is made equal to the resistivity of the select lines and word lines, and the circuitry design is facilitated.

[Modification of the Fourth Embodiment]

Figure 37:
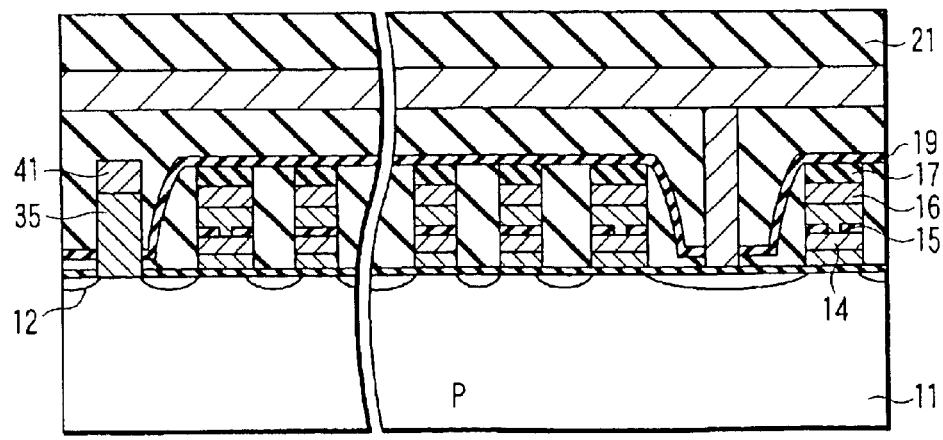
FIG. 37 is a cross-sectional view showing the structure of a semiconductor device according to a modification of the fourth embodiment.

FIG. 37 shows a modification of the fourth embodiment. Like the fourth embodiment, the source line has a stacked structure. The lower layer 35 (in contact with the n-type diffusion layer 12) of the stacked structure is formed of, e.g. impurity-doped polysilicon, and the upper layer 41 is formed of a material having a lower resistivity than polysilicon. Specifically, the upper layer 41 of the source line is formed of a metal compound of silicon, such as NiSi, MoSi, TiSi or CoSi, having a thickness of, e.g. about 10 nm to 300 nm. Alternatively, the upper layer 41 is formed of a silicon metal compound such as tungsten silicide (WSi), or a metal such as Cu, Al or W.

This modification differs from the fourth embodiment in that the control gate electrode 16 of each memory cell and each select transistor is not formed in the same layer as the upper layer 41 of the source line.

In this modification, the upper layer of the source line is formed in a layer different from the layer of the control gate 16 of each select transistor or each memory cell. Thus, the step of removing the barrier insulation film 19 and cap insulation 17 covering the select transistors and memory cell portions is not necessary, and the fabrication steps can be simplified.

Like the fourth embodiment, the conductive material that forms the source line has the stacked structure, and the source line resistivity is decreased. Thereby, an increase in height of the source line SL is prevented, and also an increase in the aspect ratio of the bit line contact is prevented. Thus, the processing is facilitated. Further, the height of the source line is determined by the gates of the select transistors and memory cell transistors and therefore the height of the source line can stably be set. Since a variance in source line resistivity is decreased, a variance in characteristics of the nonvolatile memory, in particular, in the data read-out mode, can be reduced. Note that this modification is applicable not only to the floating-gate-type memory cell transistors but also to MONOS type memory cell transistors.

Figure 38A:
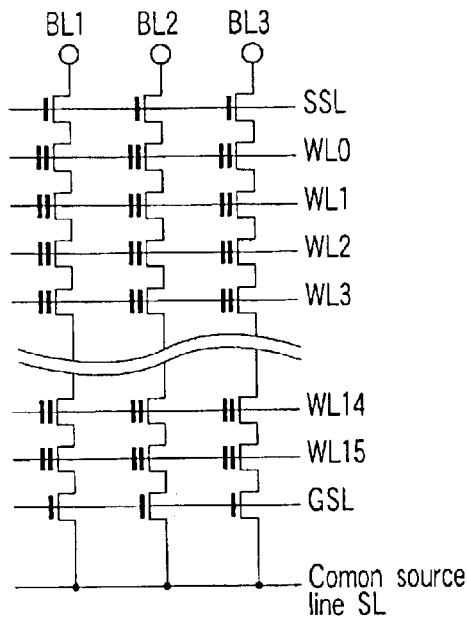
FIGS. 38A to 38C are circuit diagrams of nonvolatile memories to which the embodiments of the present invention can be applied.
Figure 38B:
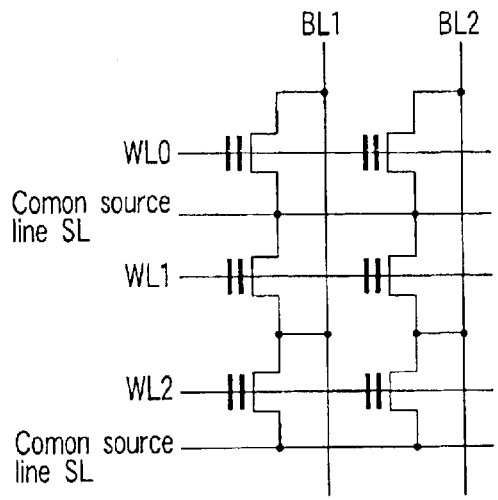
Figure 38C:
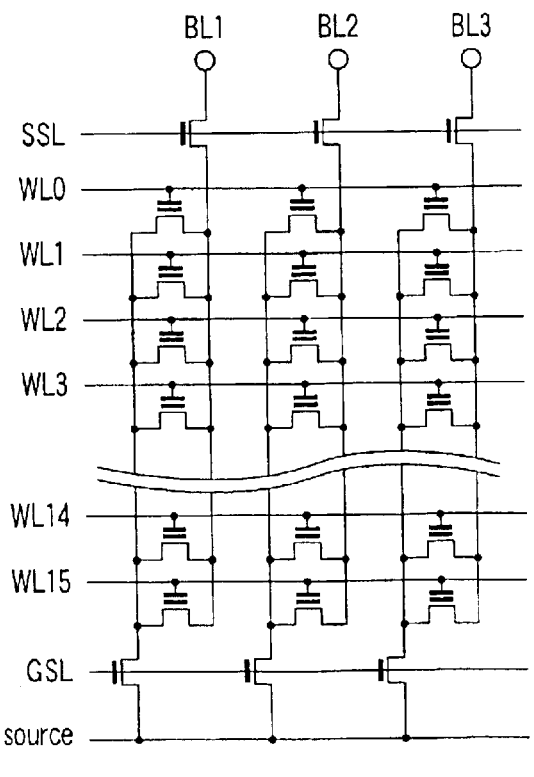

In the first to fourth embodiments and modifications, the common source line SL of the NAND-type EEPROM as shown in FIG. 38A is described by way of example. However, a common source line of a NOR-type EEPROM as shown in FIG. 38B or a common source line of an AND-type EEPROM as shown in FIG. 38C may be formed to have the stacked structure as shown in the first to fourth embodiments and modifications. The first and second embodiments use an SA-STI (Self Align-Shallow Trench Isolation) process for forming device isolation regions in a self-alignment manner with respect to the floating gate or control gate electrode. Alternatively, the gate insulation film and gate electrode may be formed after the device isolation regions are formed.

The memory cell transistor may have a stacked gate structure such as a floating gate type, or a single-layer gate structure such as a MONOS type. Further, the select transistor and memory cell transistor may have the same structure or different structures. The select line and word line may have the same structure or different structures. For example, the gate electrode 14 and gate electrode 16 of the select transistor in the first embodiment may not be connected, and the gate electrode 14 formed in the same layer as the floating gate electrode may be used as a select line. In these modifications, too, the common source line may have the stacked structure, and the source line resistivity is made lower than in the conventional single-layer structure of polysilicon. Thereby, an increase in height of the source line is prevented, and also an increase in the aspect ratio of the bit line contact is prevented. Thus, the processing is facilitated. Preferably, the height of the source line may be determined by the gates of the select transistors and memory cell transistors. Thereby, since a variance in source line resistivity is decreased, a variance in characteristics of the device can be reduced. More preferably, a part or the entirety of the source line may be provided in the same layer as the select line (the control gate electrode of the select transistor) and the word line (the control gate line of the memory cell transistor). Hence, the number of fabrication steps can be reduced and the processing of the semiconductor device can be facilitated. Therefore, the manufacturing cost is reduced and the device yield is increased.

As has been described above, according to the semiconductor devices and fabrication methods of the embodiments of the present invention, the conductive material that forms the source line has the stacked structure, and the source line resistivity is decreased. Thereby, an increase in height of the source line SL is prevented, and also an increase in the aspect ratio of the bit line contact is prevented. Thus, the processing is facilitated. Besides, a part or the entirety of the conductive material that forms the source line is provided in the same layer as the control gates of the select transistors and memory cell transistors (i.e. select lines and word lines). Hence, the fabrication steps can be simplified, the source line resistivity is made equal to the resistivity of the select lines and word lines, and the circuitry design is facilitated. Furthermore, a decrease in lithography margin such as an exposure latitude in the step of patterning the gate electrodes can be suppressed.

The above-described embodiments can be practiced singly or in combination, as desired. Furthermore, each embodiment includes inventions in various stages, and various inventions can be derived from desired combinations of structural elements disclosed herein.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate of a first conductivity type;
   a source region and a drain region of a second conductivity type formed in the semiconductor substrate such that the source region and the drain region are spaced apart;
   a first gate insulation film formed on the semiconductor substrate between the source region and the drain region;
   a floating gate formed on the first gate insulation film;
   a second gate insulation film formed on the floating gate;
   a control gate formed on the second gate insulation film; and
   a source line formed on the semiconductor substrate and including a first conductive film and a second conductive film, the first conductive film being formed of the same material as that of the floating gate, and the second conductive film being provided on the first conductive film and formed of the same material as that of the control gate,
   wherein the floating gate and the first conductive film include polysilicon films, and the control gate and the second conductive film include polysilicon films and suicide films formed on the polysilicon films.

2. A semiconductor device comprising:
   a semiconductor substrate of a first conductivity type;
   a source region and a drain region of a second conductivity type formed in the semiconductor substrate such that the source region and the drain region are spaced apart;
   a first gate insulation film formed on the semiconductor substrate between the source region and the drain region;
   a floating gate formed on the first gate insulation film;
   a second gate insulation film formed on the floating gate;
   a control gate formed on the second gate insulation film; and
   a source line formed on the semiconductor substrate and including a first conductive film and a second conductive film, the first conductive film being formed of the same material as that of the floating gate, and the second conductive film being provided on the first conductive film and formed of the same material as that of the control gate,
   wherein a plurality of memory cell transistors each having the source region, the drain region, the floating gate and the control gate are formed, and the plurality of memory cell transistors are connected in series via the source region and the drain region, thereby constituting a NAND-type cell.

3. A semiconductor device comprising:
   a memory cell transistor including a first insulation film, a floating gate, a second insulation film and a control gate, the floating gate being formed on the semiconductor substrate with the first insulation film interposed, and the control gate being formed on the floating gate, with the second insulation film interposed;
   a select transistor including a third insulation film, a first conductive film, a fourth insulation film and a second conductive film, the first conductive film being formed on the semiconductor substrate with the third insulation film interposed, the first conductive film being formed of the same material as that of the floating gate, the fourth insulation film being formed on the first conductive film and having an opening, and the second conductive film being formed on the fourth insulation film and formed of the same material as that of the control gate; and
   a source line including a third conductive film and a fourth conductive film, the third conductive film being formed on the semiconductor substrate and formed of the same material as that of the floating gate, a fifth insulation film being formed on the third conductive film and having an opening, and the fourth conductive film being formed on the fifth insulation film and formed of the same material as that of the control gate.

4. The semiconductor device according to claim 3, wherein each of the floating gate, the first conductive film and the third conductive film includes a polysilicon film, and each of the control gate, the second conductive film and the fourth conductive film includes a polysilicon film and one selected from the group consisting of a silicide film, a silicon-metal compound and a metal, which is formed on the polysilicon film.

5. The semiconductor device according to claim 3, wherein the floating gate, the first conductive film and the third conductive film include polysilicon films, and each of the control gate, the second conductive film and the fourth conductive film includes one of a silicon-metal compound and a metal.

6. The semiconductor device according to claim 3, wherein a height from a surface of the semiconductor substrate to an upper surface of the fourth conductive film of the source line is lower than a height from the surface of the semiconductor substrate to an upper surface of the control gate of the memory cell transistor.

* * * * *

UNITED STATES PATENT AND TRADEMARK OFFICE
CERTIFICATE OF CORRECTION

PATENT NO. : 6,953,965 B2
DATED : October 11, 2005
INVENTOR(S) : Akira Goda et al.

It is certified that error appears in the above-identified patent and that said Letters Patent is hereby corrected as shown below:

Column 24,
Line 13, change "suicide" to -- silicide --.

Signed and Sealed this

Sixteenth Day of May, 2006

JON W. DUDAS
*Director of the United States Patent and Trademark Office*